US011140342B2

(12) United States Patent
Yokogawa et al.

(10) Patent No.: US 11,140,342 B2
(45) Date of Patent: Oct. 5, 2021

(54) SOLID-STATE IMAGE PICKUP DEVICE AND ELECTRONIC APPARATUS

(71) Applicant: Sony Corporation, Tokyo (JP)

(72) Inventors: Sozo Yokogawa, Kanagawa (JP); Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/738,236

(22) Filed: Jan. 9, 2020

(65) Prior Publication Data

US 2020/0145595 A1  May 7, 2020

Related U.S. Application Data

(63) Continuation of application No. 16/291,427, filed on Mar. 4, 2019, which is a continuation of application
(Continued)

(30) Foreign Application Priority Data

Dec. 18, 2014 (JP) .................................. 2014-256044
Feb. 23, 2015 (JP) .................................. 2015-032578

(51) Int. Cl.
*H04N 5/369* (2011.01)
*H01L 27/146* (2006.01)
(Continued)

(52) U.S. Cl.
CPC .......... *H04N 5/36961* (2018.08); *G02B 7/34* (2013.01); *G02B 7/38* (2013.01);
(Continued)

(58) Field of Classification Search
CPC .......... H04N 5/36961; H04N 9/04557; H04N 5/23212; H04N 9/045; H04N 5/3696;
(Continued)

(56) References Cited

U.S. PATENT DOCUMENTS 8,102,460 B2 * 1/2012 Awazu ............. H01L 27/14605
348/340
8,754,967 B2 6/2014 Hirota
(Continued)

FOREIGN PATENT DOCUMENTS

CN        103852857 A    6/2014
EP          2164269 A1    3/2010
(Continued)

OTHER PUBLICATIONS

Extended European Search Report dated Apr. 8, 2020 in connection with European Application No. 19193816.6.
(Continued)

*Primary Examiner* — Yogesh K Aggarwal
(74) *Attorney, Agent, or Firm* — Wolf, Greenfield & Sacks, P.C.

(57) ABSTRACT

The present disclosure relates to a solid-state image pickup device and an electronic apparatus by which a phase-difference detection pixel that avoids defects such as lowering of sensitivity to incident light and lowering of phase-difference detection accuracy can be realized. A solid-state image pickup device as a first aspect of the present disclosure is a solid-state image pickup device in which a normal pixel that generates a pixel signal of an image and a phase-difference detection pixel that generates a pixel signal used in calculation of a phase-difference signal for controlling an image-surface phase difference AF function are arranged in a mixed manner, in which, in the phase-difference detection pixel, a shared on-chip lens for condensing incident light to a photoelectric converter that generates a pixel signal used in calculation of the phase-difference signal is formed for every plurality of adjacent phase-difference detection pixels. The present disclosure is appli-
(Continued)

cable to a backside illumination CMOS image sensor and an electronic apparatus equipped with the same.

29 Claims, 34 Drawing Sheets

Related U.S. Application Data

No. 15/534,621, filed as application No. PCT/JP2015/084389 on Dec. 8, 2015, now Pat. No. 10,284,799.

(51) Int. Cl.
*H04N 9/04* (2006.01)
*G02B 7/34* (2021.01)
*G02B 7/38* (2021.01)

(52) U.S. Cl.
CPC .. *H01L 27/14605* (2013.01); *H01L 27/14621* (2013.01); *H01L 27/14623* (2013.01); *H01L 27/14627* (2013.01); *H04N 9/04557* (2018.08); *H01L 27/1463* (2013.01)

(58) Field of Classification Search
CPC ......... H01L 27/14605; H01L 27/14621; H01L 27/14623; H01L 27/14627; H01L 27/1463; H01L 27/146; G02B 7/34; G02B 7/38
See application file for complete search history.

(56) References Cited

U.S. PATENT DOCUMENTS

| | | | |
|---|---|---|---|
| 10,284,799 B2 | 5/2019 | Yokogawa et al. | |
| 2004/0246369 A1 | 12/2004 | Yamazaki | |
| 2007/0206937 A1 | 9/2007 | Kusaka | |
| 2009/0090841 A1 | 4/2009 | Kusaka | |
| 2009/0096049 A1* | 4/2009 | Oshiyama | H01L 27/14818 257/432 |
| 2010/0091161 A1* | 4/2010 | Suzuki | H01L 27/14609 348/302 |
| 2010/0238330 A1 | 9/2010 | Hirota | |
| 2010/0245656 A1 | 9/2010 | Fujii et al. | |
| 2012/0194696 A1 | 8/2012 | Ohshitanai et al. | |
| 2013/0015545 A1 | 1/2013 | Toumiya et al. | |
| 2013/0057735 A1 | 3/2013 | Hirota | |
| 2013/0161774 A1 | 6/2013 | Okigawa | |
| 2014/0078366 A1 | 3/2014 | Dokoutchaev et al. | |
| 2014/0146197 A1 | 5/2014 | Okuzawa et al. | |
| 2014/0168498 A1 | 6/2014 | Ono | |
| 2015/0062390 A1* | 3/2015 | Kim | G02B 3/0043 348/273 |
| 2015/0163464 A1 | 6/2015 | Egawa et al. | |
| 2016/0013449 A1 | 1/2016 | Cui et al. | |
| 2017/0366770 A1 | 12/2017 | Yokogawa et al. | |
| 2019/0199950 A1 | 6/2019 | Yokogawa et al. | |

FOREIGN PATENT DOCUMENTS

| | | |
|---|---|---|
| JP | 2007-103590 A | 4/2007 |
| JP | 2007-158109 A | 6/2007 |
| JP | 2007-233032 A | 9/2007 |
| JP | 2007-281296 A | 10/2007 |
| JP | 2007-304188 A | 11/2007 |
| JP | 2007-317951 A | 12/2007 |
| JP | 2008-312073 A | 12/2008 |
| JP | 2010-239337 A | 10/2010 |
| JP | 2011-049472 A | 3/2011 |
| JP | 2011/210748 A | 10/2011 |
| JP | 2012-160906 A | 8/2012 |
| JP | 2012-235444 A | 11/2012 |
| JP | 2013-021168 A | 1/2013 |
| JP | 2014-107835 A | 6/2014 |
| WO | WO 2012/026292 A1 | 3/2012 |

OTHER PUBLICATIONS

International Search Report and Written Opinion and English translation there of dated Mar. 1, 2016 in connection with International Application No. PCT/JP2015/084389.
International Preliminary Report on Patentability and English translation thereof dated Jun. 29, 2017 in connection with International Application No. PCT/JP2015/084389.
Partial European Search Report dated Jul. 23, 2018 in connection with European Application No. 15869845.6.
Extended European Search Report dated Oct. 24, 2018 in connection with European Application No. 15869845.6.
Japanese Office Action dated Dec. 12, 2019 in connection with Japanese Application No. 2016-564798 and English translation thereof.
Japanese Office Action dated May 12, 2020 in connection with Japanese Application No. 2016-564798, and English translation thereof.
Chinese Office Action dated Jan. 19, 2020 in connection with Chinese Application No. 201580067441.6 and English translation thereof.
U.S. Appl. No. 15/534,621, filed Jun. 9, 2017, Yokogawa et al.
U.S. Appl. No. 16/291,427, filed Mar. 4, 2019, Yokogawa et al.

* cited by examiner

SOLID-STATE IMAGE PICKUP DEVICE AND ELECTRONIC APPARATUS

CROSS-REFERENCE TO RELATED APPLICATIONS

The present application claims the benefit under 35 U.S.C. § 120 as a continuation application of U.S. application Ser. No. 16/291,427, filed on Mar. 4, 2019, which claims the benefit under 35 U.S.C. § 120 as a continuation application of U.S. application Ser. No. 15/534,621, filed on Jun. 9, 2017, now U.S. Pat. No. 10,284,799, which is a National Stage of International Application No. PCT/JP2015/084389, filed in the Japanese Patent Office as a Receiving office on Dec. 8, 2015, which claims priority to Japanese Patent Application Number 2015-032578, filed in the Japanese Patent Office on Feb. 23, 2015 and Japanese Patent Application Number 2014-256044, filed in the Japanese Patent Office on Dec. 18, 2014, each of which is hereby incorporated by reference in its entirety.

TECHNICAL FIELD

The present disclosure relates to a solid-state image pickup device and an electronic apparatus and more particularly to a solid-state image pickup device and an electronic apparatus that are suitable to be used in the case where phase-difference detection pixels for realizing an image-surface phase difference AF (Auto Focus) function are arranged.

BACKGROUND ART

Conventionally, an image-surface phase difference AF is known as an AF function system employed in an electronic apparatus represented by a digital camera having a photographing function (e.g., see Patent Literature 1). In a solid-state image pickup device that realizes the image-surface phase difference AF, normal pixels for obtaining pixel signals (color signals) that constitutes an image as well as phase-difference detection pixels for pupil splitting of incident light are arranged at predetermined positions.

In a conventional phase-difference detection pixel, a metal light-shielding film is formed between an on-chip lens and a photoelectric conversion layer. The metal light-shielding film has an opening shifted with respect to an optical axis (optical center) of the on-chip lens. In addition, a light-shielding structure is provided between a pair of phase-difference detection pixels arranged adjacent to each other. The light-shielding structure is for reducing optical color mixing.

A phase-difference signal is calculated on the basis of outputs of the pair of phase-difference detection pixels having openings at different positions (e.g., phase-difference detection pixel opened on left-hand side thereof and phase-difference detection pixel opened on right-hand side thereof). The calculated phase-difference signal is used for controlling focus.

CITATION LIST

Patent Literature

Patent Literature 1: Japanese Patent Application Laid-open No. 2007-304188

DISCLOSURE OF INVENTION

Technical Problem

In the above-mentioned conventional phase-difference detection pixel, the opening is limited by the metal light-shielding film. Therefore, in comparison with a normal pixel, lowering of sensitivity to incident light is inevitable. Thus, an adverse effect in practice can occur. For example, the image-surface phase difference AF cannot be utilized in the case of photographing in a dark place.

Further, pixels will be miniaturized along with an increase in the number of pixels in the solid-state image pickup device in future. In that case, not only reflection of incident light on the metal light-shielding film but also influence of behaviors associated with electromagnetic waves, such as diffraction, become remarkable. For example, lowering of accuracy of phase-difference detection and deterioration of an image quality characteristic due to mixing of reflected/diffracted components into adjacent pixels can occur.

In addition, with the phase-difference detection pixel including the metal light-shielding film, an angle range in which a sensitivity response to a change in angle of incidence is provided is narrow. Therefore, it is difficult for such a phase-difference detection pixel to be used with a lens having a small f-number, an optical zoom lens whose CRA (Chief Ray Angle) is largely variable, or the like.

The present disclosure has been made in view of the above-mentioned circumstances to propose a phase-difference detection pixel capable of avoiding defects such as lowering of sensitivity to incident light and lowering of phase-difference detection accuracy.

Solution to Problem

A solid-state image pickup device as a first aspect of the present disclosure is a solid-state image pickup device in which a normal pixel that generates a pixel signal of an image and a phase-difference detection pixel that generates a pixel signal used in calculation of a phase-difference signal for controlling an image-surface phase difference AF function are arranged in a mixed manner, in which, in the phase-difference detection pixel, a shared on-chip lens for condensing incident light to a photoelectric converter that generates a pixel signal used in calculation of the phase-difference signal is formed for every plurality of adjacent phase-difference detection pixels.

In the normal pixel, an individual on-chip lens for condensing incident light to a photoelectric converter that generates a pixel signal of the image can be formed for each normal pixel.

An inter-pixel light-shielding structure can be provided between the normal pixel and the normal pixel and between the normal pixel and the phase-difference detection pixel.

An inter-pixel light-shielding structure can also be provided between the phase-difference detection pixel and the phase-difference detection pixel.

The phase-difference detection pixel can include an opening light-shielding structure that limits an opening of the photoelectric converter.

In the phase-difference detection pixel, the shared on-chip lens can be formed for every two adjacent pixels.

In the phase-difference detection pixel, two shared on-chip lenses can be formed for every three adjacent pixels.

A boundary between the individual on-chip lens formed in the normal pixel and the shared on-chip lens formed in the phase-difference detection pixel can be approximately rectangular or approximately hexagonal.

A dummy light-condensing element structure can be formed between the individual on-chip lens formed in the normal pixel and the shared on-chip lens formed in the plurality of adjacent phase-difference detection pixels.

The dummy light-condensing element structure can be formed non-symmetrically with respect to the plurality of phase-difference detection pixels that share the shared on-chip lens.

The plurality of phase-difference detection pixels that share the shared on-chip lens can be arranged in a checkerboard pattern.

The phase-difference detection pixel can be linearly arranged in at least either one of a row direction and a column direction.

The phase-difference detection pixel can be arranged in a stripe pattern in at least either one of a row direction and a column direction.

The phase-difference detection pixels arranged in stripes adjacent to each other in the stripe form can have phases shifted from each other.

A color filter having selective sensitivity to three or more kinds of different wavelengths can be provided for each pixel, and the plurality of phase-difference detection pixels that share the shared on-chip lens can include the color filter having selective sensitivity to a same wavelength.

A color filter having selective sensitivity to three or more kinds of different wavelengths can be provided for pixel, and the plurality of phase-difference detection pixels that share the shared on-chip lens can include the color filter having selective sensitivity to different wavelengths.

The phase-difference detection pixel can have a pixel size larger than that of the normal pixel.

All pixels including a color filter having selective sensitivity to a particular wavelength of three or more kinds of different wavelengths can be the phase-difference detection pixels, and an output of the phase-difference detection pixel can be also used as a pixel signal of an image.

The phase-difference detection pixel that shares the shared on-chip lens can have a size that is an integer multiple of that of the normal pixel, the photoelectric converter of the phase-difference detection pixel is divided into a plurality of regions including a central region from which a same oblique incidence characteristic as a photoelectric converter of the normal pixel is obtained, and an output of the central region can be also used as a pixel signal of an image.

The phase-difference detection pixel that shares the shared on-chip lens can have a size that is twice as large as that of the normal pixel, the photoelectric converter of the phase-difference detection pixel is divided into three regions at approximately 0.5:1:0.5, and an output of the region corresponding to 1 of the ratio can be also used as a pixel signal of an image.

The phase-difference detection pixel that shares the shared on-chip lens can have a size that is twice as large as that of the normal pixel, the photoelectric converter of the phase-difference detection pixel is divided into four regions at approximately 0.5:0.5:0.5:0.5, and an addition value of outputs of the regions respectively corresponding to 0.5 and 0.5 at a center of the ratio can be also used as a pixel signal of an image.

An electronic apparatus as a second aspect of the present disclosure is an electronic apparatus including a solid-state image pickup device in which a normal pixel that generates a pixel signal of an image and a phase-difference detection pixel that generates a pixel signal used in calculation of a phase-difference signal for controlling an image-surface phase difference AF function are arranged in a mixed manner, in which, in the phase-difference detection pixel, a shared on-chip lens for condensing incident light to a photoelectric converter that generates a pixel signal used in calculation of the phase-difference signal is formed for every plurality of adjacent phase-difference detection pixels.

Advantageous Effects of Invention

In accordance with the first aspect of the present disclosure, it is possible to realize a solid-state image pickup device that avoids defects such as lowering of the sensitivity to incident light, lowering of the phase-difference detection accuracy, and the like.

In accordance with the second aspect of the present disclosure, it is possible to realize a highly accurate electronic apparatus having an image-surface phase difference AF function.

BRIEF DESCRIPTION OF DRAWINGS

FIG. 16 FIG. 14 is a top view of a shared on-chip lens.

FIG. 18 FIG. 17 is a top view of a shared on-chip lens.

MODE(S) FOR CARRYING OUT THE INVENTION

Hereinafter, best modes for carrying out the present disclosure (hereinafter, referred to as embodiments) will be described in detail with reference to the drawings.

<Configuration Example of Normal Pixels in Solid-State Image Pickup Device to Which Present Disclosure is Applied>

First of all, although the present disclosure mainly relates to phase-difference detection pixels arranged in a solid-state image pickup device, a configuration example of normal pixels arranged together with phase-difference detection pixels in the solid-state image pickup device to which the present disclosure is applied will be described for the sake of comparison with the phase-difference detection pixels.

Figure 1:
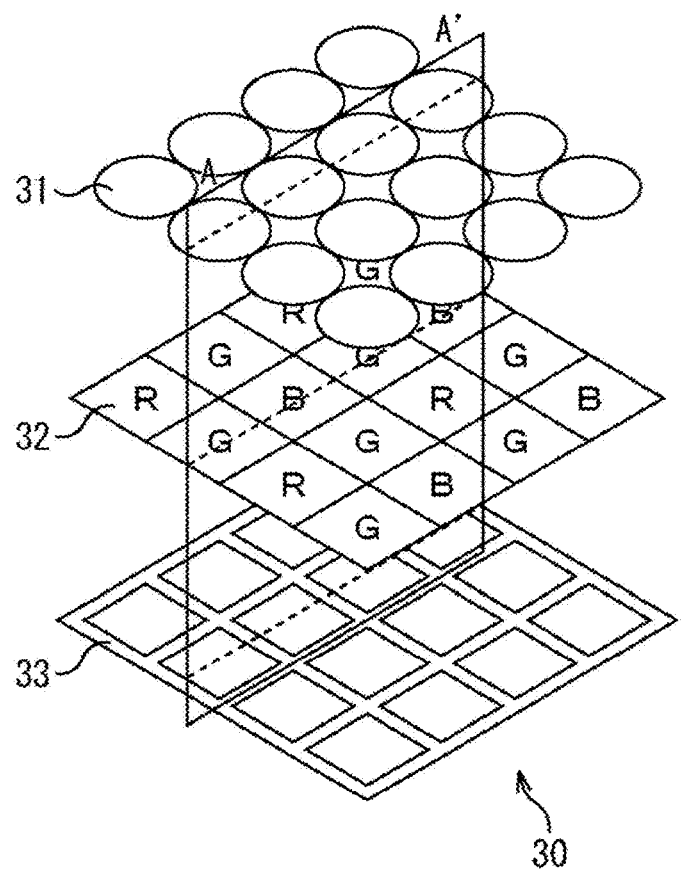
FIG. 1 A perspective view showing a configuration example of normal pixels in a solid-state image pickup device to which the present disclosure is applied.
Figure 2:
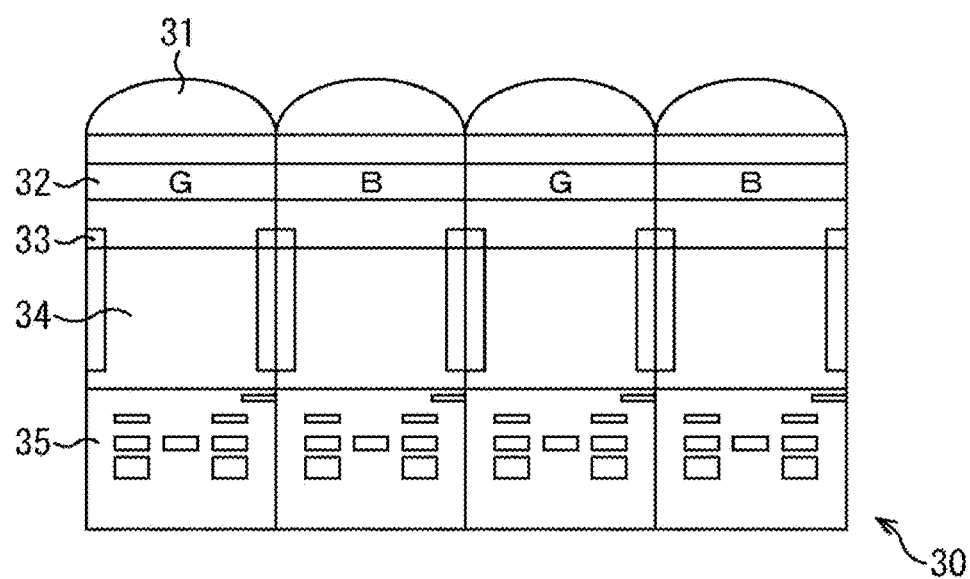
FIG. 2 A cross-sectional view corresponding to FIG. 1.

FIG. 1 is a schematic perspective view extracting and showing only normal pixels 30 as a range of 4*4 pixels in the solid-state image pickup device to which the present disclosure is applied. FIG. 2 is a schematic sectional view taken along A-A' of FIG. 1.

The normal pixels 30 include individual on-chip lenses 31, a color filter layer 32, inter-pixel light-shielding structures 33, photoelectric converters 34, and a signal wiring layer 35 in order from an upper surface side (incident surface side).

The individual on-chip lens 31 is formed for each pixel in order to cause incident electromagnetic waves (hereinafter, referred to as incident light) to more efficiently enter the photoelectric converter 34 that corresponds to a layer below it. The color filter layer 32 is formed in such a manner that color filters colored in any of R-, G-, and B-colors arranged in accordance with, for example, the Bayer array cover respective pixels in order to cause part of incident light, which has a particular wavelength, to pass therethrough toward a layer below it.

The inter-pixel light-shielding structures 33 are made of metal material or the like in order to reduce optical color mixing between adjacent pixels. The photoelectric converters 34 include photodiodes that generate and accumulate electric charges in a manner that depends on incident light entering them via the individual on-chip lenses 31 and the color filter layer 32. The signal wiring layer 35 reads out signal electric charges generated and accumulated by the photoelectric converters 34 and outputs the read-out signal electric charges to the subsequent stage.

<First Configuration Example of Phase-Difference Detection Pixel in Solid-State Image Pickup Device to Which Present Disclosure is Applied>

Figure 3:
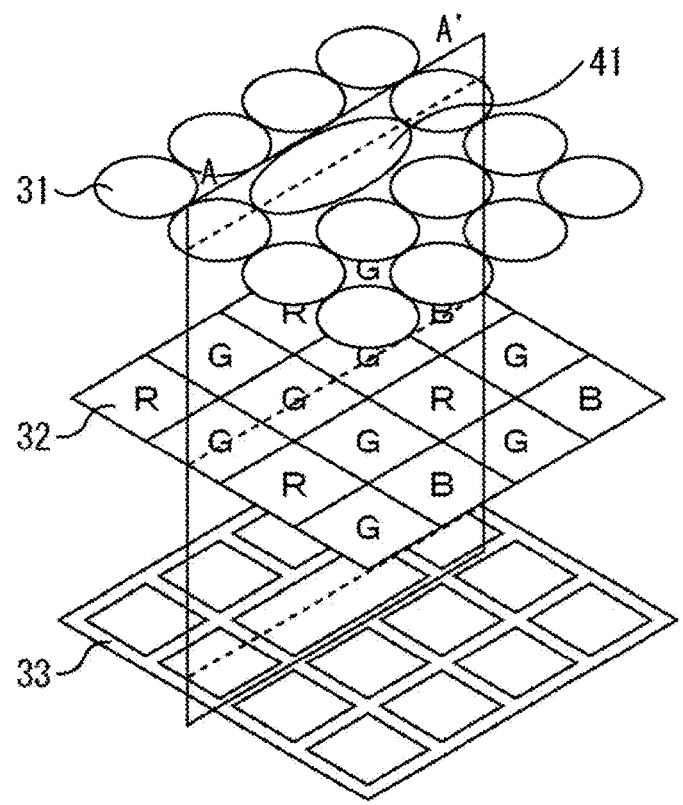
FIG. 3 A perspective view showing a first configuration example of a phase-difference detection pixel in the solid-state image pickup device to which the present disclosure is applied.
Figure 4:
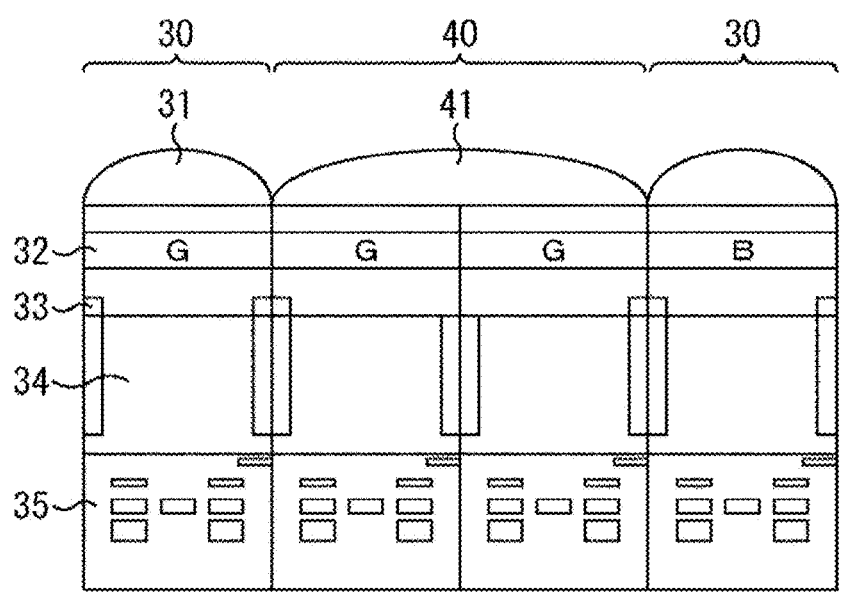
FIG. 4 A cross-sectional view corresponding to FIG. 3.

Next, a first configuration example of the phase-difference detection pixel in the solid-state image pickup device to which the present disclosure is applied will be described. FIG. 3 is a schematic perspective view extracting and showing a range of 16 (=4*4) pixels in the solid-state image pickup device to which the present disclosure is applied. Two pixels of them are phase-difference detection pixels 40 as the first configuration example. Other 14 pixels are normal pixels 30. FIG. 4 is a schematic sectional view taken along A-A' of FIG. 3. In the figure, two pixels at the center are the phase-difference detection pixels 40. Note that components common among the phase-difference detection pixels 40 and the normal pixels 30 are denoted by identical signs. Therefore, descriptions thereof will be appropriately omitted. The same applies to a second configuration example and the like to be described later.

The phase-difference detection pixels 40 include a shared on-chip lens 41, a color filter layer 32, inter-pixel light-shielding structures 33, photoelectric converters 34, and a signal wiring layer 35 in order from an upper surface side (incident surface side).

Figure 5:
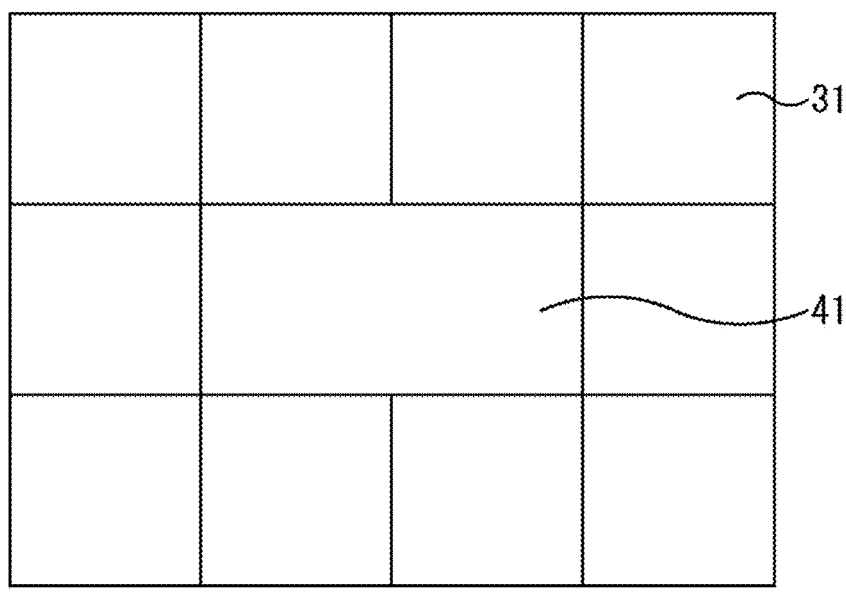
FIG. 5 A top view of a shared on-chip lens of FIG. 3.

FIG. 5 shows a top view of the shared on-chip lens 41. As shown in the figure, the shared on-chip lens 41 is formed to cover the plurality of (in this figure, two) adjacent phase-difference detection pixels 40. That is, the first configuration example shown in FIGS. 3 and 4 has a configuration in which the two phase-difference detection pixels 40 share the shared on-chip lens 41.

Note that the inter-pixel light-shielding structures 33, which are formed between the normal pixels 30 and between the normal pixel 30 and the phase-difference detection pixel 40, are not formed between the plurality of phase-difference detection pixels 40 that share the shared on-chip lens 41. It should be noted that the inter-pixel light-shielding structures 33 may be formed between the plurality of phase-difference detection pixels 40 that share the shared on-chip lens 41.

As shown in the figure, with the solid-state image pickup device in which the normal pixels 30 and the phase-difference detection pixels 40 are arranged, an increase in resolution and quality of picked-up images can be realized by the normal pixels 30. Further, in the phase-difference detection pixels 40, light is not blocked by the light-shielding structures and a phase difference is detected by light-condensing power of the shared on-chip lens 41. Thus, phase-difference detection with high sensitivity and good separation ratio characteristic becomes possible. In addition, no obstacles that scatter or diffract light are present in an optical path. Thus, color mixing of adjacent pixels, which can occur due to scattering or diffraction of light, is suppressed. Therefore, deterioration of the image quality can also be prevented.

<Second Configuration Example of Phase-Difference Detection Pixel in Solid-State Image Pickup Device to Which Present Disclosure is Applied>

Figure 6:
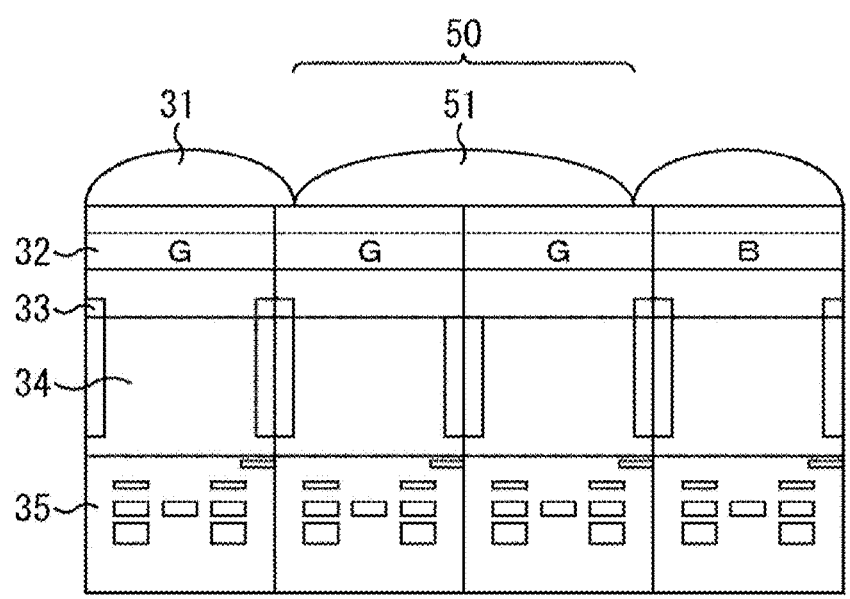
FIG. 6 A cross-sectional view showing a second configuration example of the phase-difference detection pixel in the solid-state image pickup device to which the present disclosure is applied.
Figure 7:
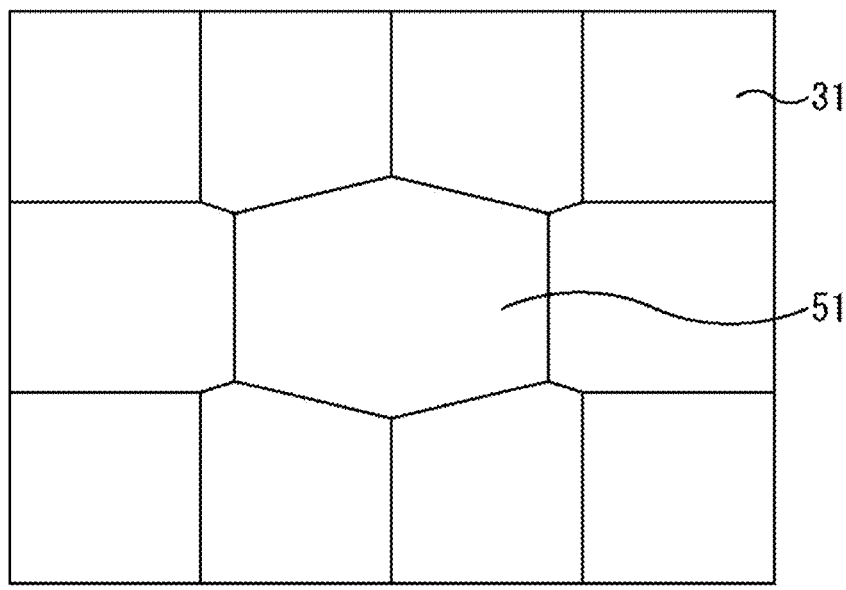
FIG. 7 A top view of a shared on-chip lens of FIG. 6.

Next, a second configuration example of the phase-difference detection pixel in the solid-state image pickup device to which the present disclosure is applied will be described. FIG. 6 is a schematic sectional view of four adjacent pixels in the solid-state image pickup device to which the present disclosure is applied. In the figure, two pixels at the center are phase-difference detection pixels 50 as the second configuration example.

The phase-difference detection pixels 50 as the second configuration example are obtained by replacing the shared on-chip lens 41 of the phase-difference detection pixels 40 as the first configuration example by a shared on-chip lens 51. That is, the second configuration example shown in FIG. 6 has a configuration in which the two phase-difference detection pixels 50 share the shared on-chip lens 51.

FIG. 6 shows a top view of the shared on-chip lens 51 that covers the two phase-difference detection pixels 50 and individual on-chip lenses 31 of adjacent normal pixels 30.

In the case where the shared on-chip lens 51 is formed using a manufacturing method similar to that of the individual on-chip lenses 31, the individual on-chip lenses 31 are tessellated having substantially no gaps between adjacent pixels and the shapes thereof are approximately rectangular. On the other hand, the shape of the shared on-chip lens 51 is approximately hexagonal. With this, no gaps are formed between the normal pixels 30 and light-condensing element structures (on-chip lenses) of the phase-difference detection pixels 50. Thus, it becomes possible to increase the sensitivity of the phase-difference detection pixels 50.

<Third Configuration Example of Phase-Difference Detection Pixel in Solid-State Image Pickup Device to Which Present Disclosure is Applied>

Figure 8:
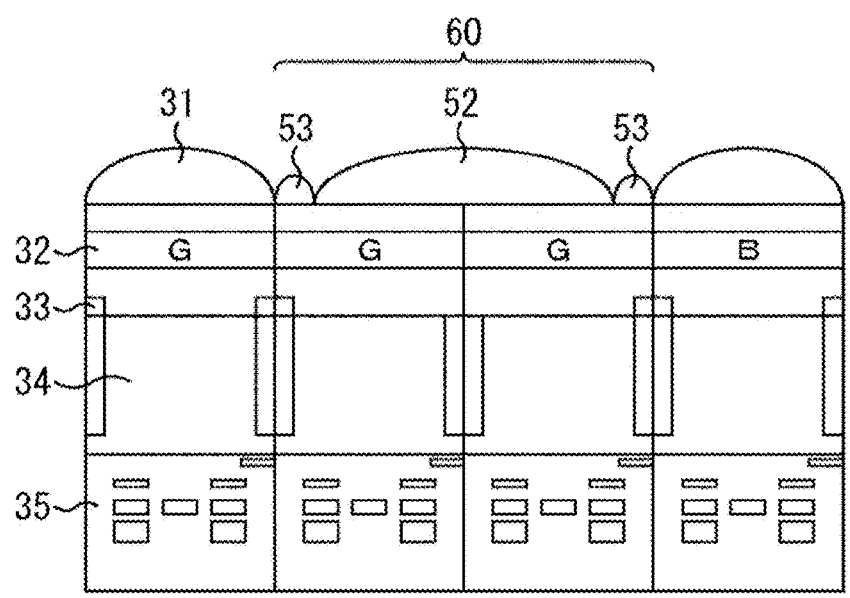
FIG. 8 A cross-sectional view showing a third configuration example of the phase-difference detection pixel in the solid-state image pickup device to which the present disclosure is applied.

Next, a third configuration example of the phase-difference detection pixel in the solid-state image pickup device to which the present disclosure is applied will be described. FIG. 8 is a schematic sectional view of four adjacent pixels in the solid-state image pickup device to which the present disclosure is applied. In the figure, two pixels at the center are phase-difference detection pixels 60 as the third configuration example.

The phase-difference detection pixels 60 as the third configuration example are obtained by replacing the shared on-chip lens 41 of the phase-difference detection pixels 40 as the first configuration example, by a shared on-chip lens 52 and dummy light-condensing element structures 53. That is, the third configuration example shown in FIG. 8 has a configuration in which the two phase-difference detection pixels 50 share the shared on-chip lens 52 and the dummy light-condensing element structures 53.

Figure 9:
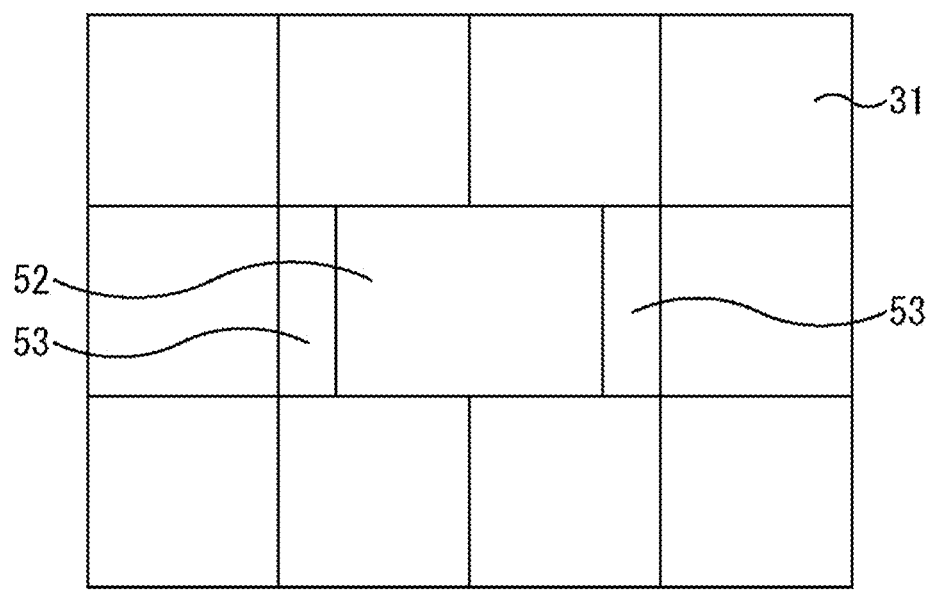
FIG. 9 A top view of a shared on-chip lens of FIG. 8.

FIG. 9 shows a top view of the shared on-chip lens 52 and the dummy light-condensing element structures 53, which cover the two phase-difference detection pixels 60, and the individual on-chip lenses 31 of adjacent normal pixels 30.

The dummy light-condensing element structures 53 are formed between the shared on-chip lens 52 that covers the phase-difference detection pixels 60 and the individual on-chip lenses 31 that cover the adjacent normal pixels 30. Due to the provision of the dummy light-condensing element structures 53, the individual on-chip lenses 31 and the shared on-chip lens 52 can be tessellated having substantially no gaps between the adjacent pixels. In addition, structure deformation thereof can be minimized and it is possible to realize a phase-difference detection pixel in which optical color mixing is reduced.

<Relationship Between Position(s) of Dummy Light-Condensing Element Structure(s) 53 in Phase-Difference Detection Pixels 60 as Third Configuration Example and Amount of Correction of Pupil Correction>

Figure 10:
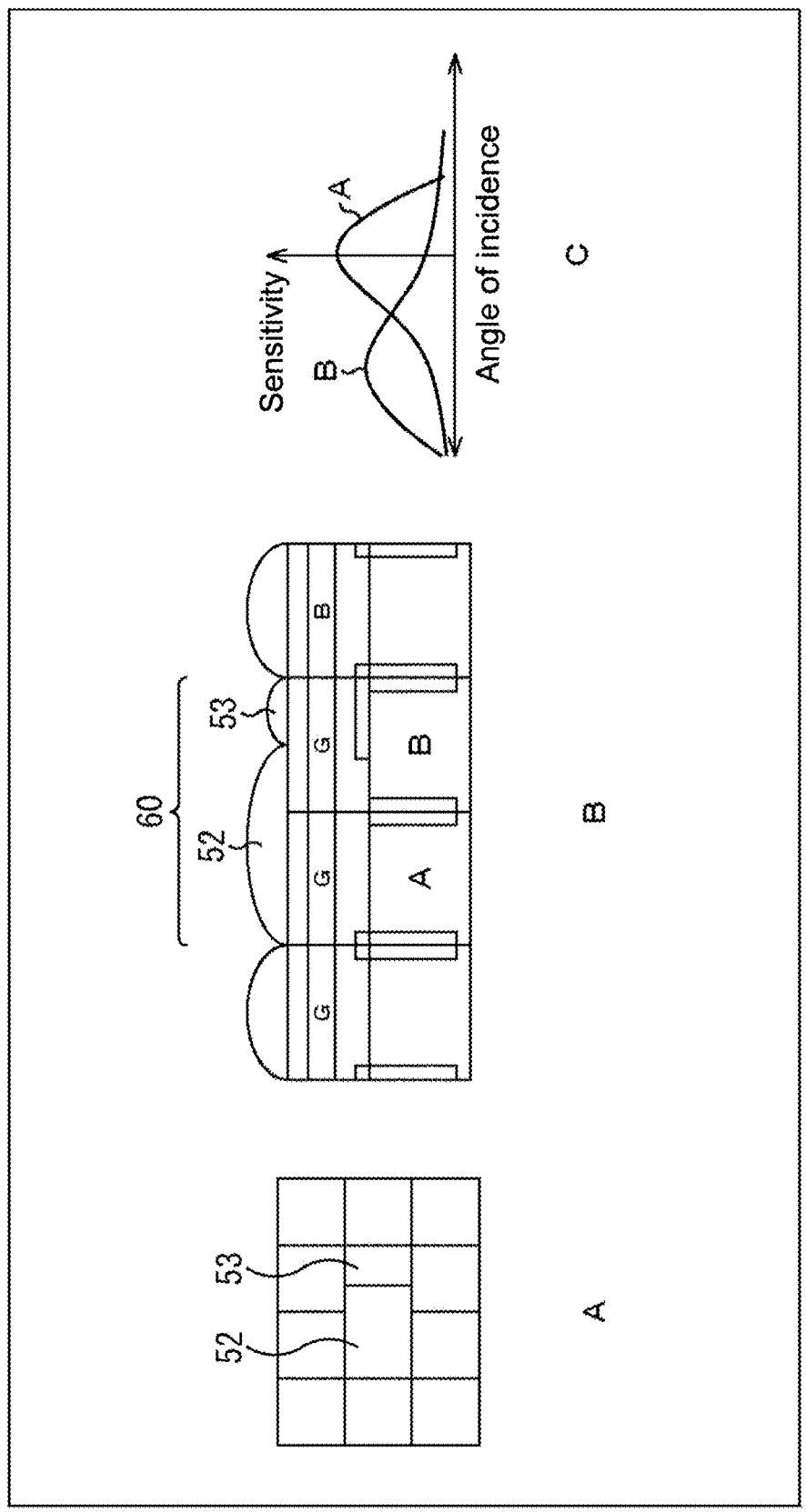
FIG. 10 A diagram for describing a relationship between a position of a dummy light-condensing element structure in the third configuration example of the phase-difference detection pixel and an amount of correction of pupil correction.
Figure 11:
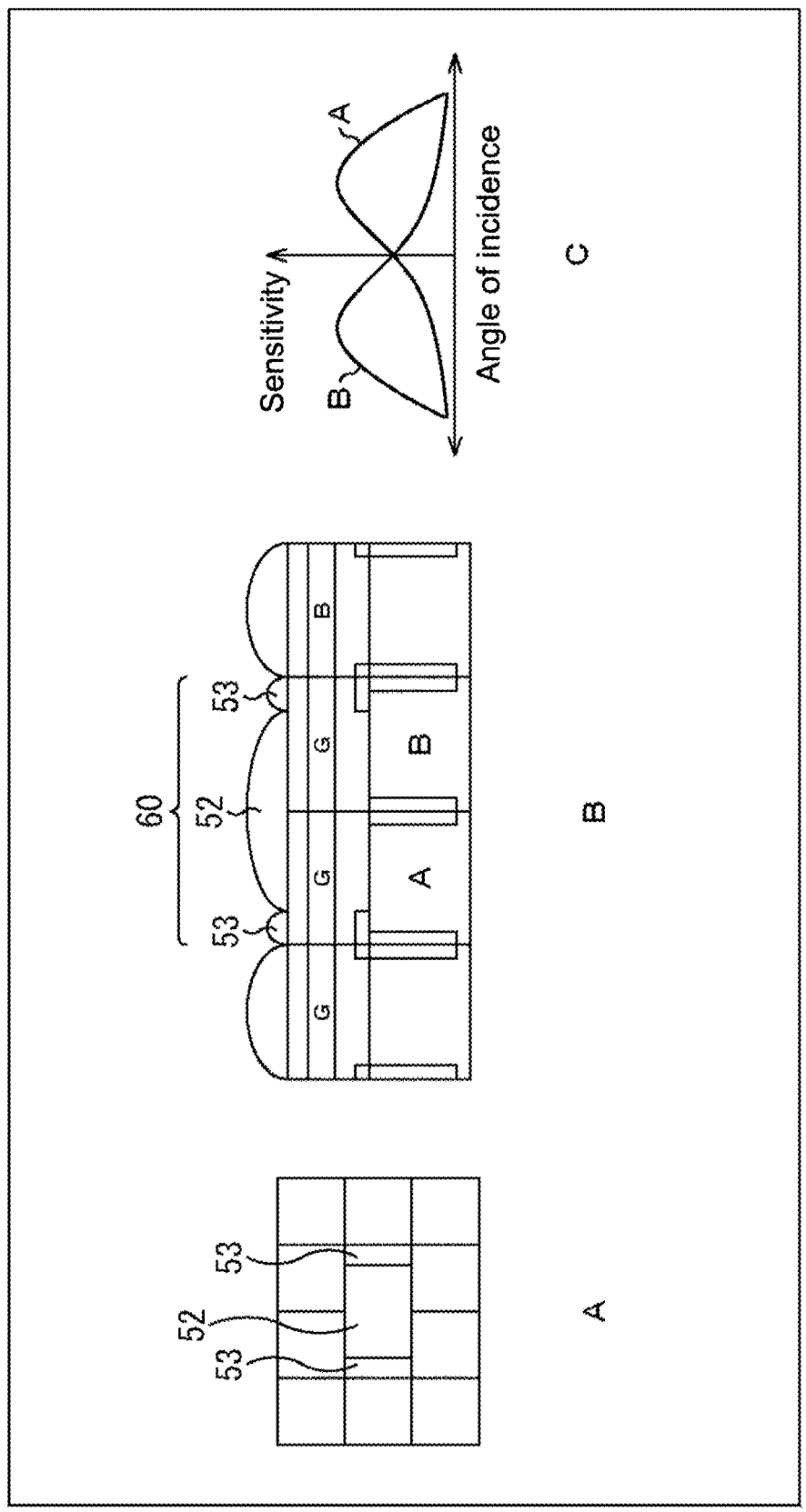
FIG. 11 A diagram for describing a relationship between positions of dummy light-condensing element structures in the third configuration example of the phase-difference detection pixel and an amount of correction of pupil correction.
Figure 12:
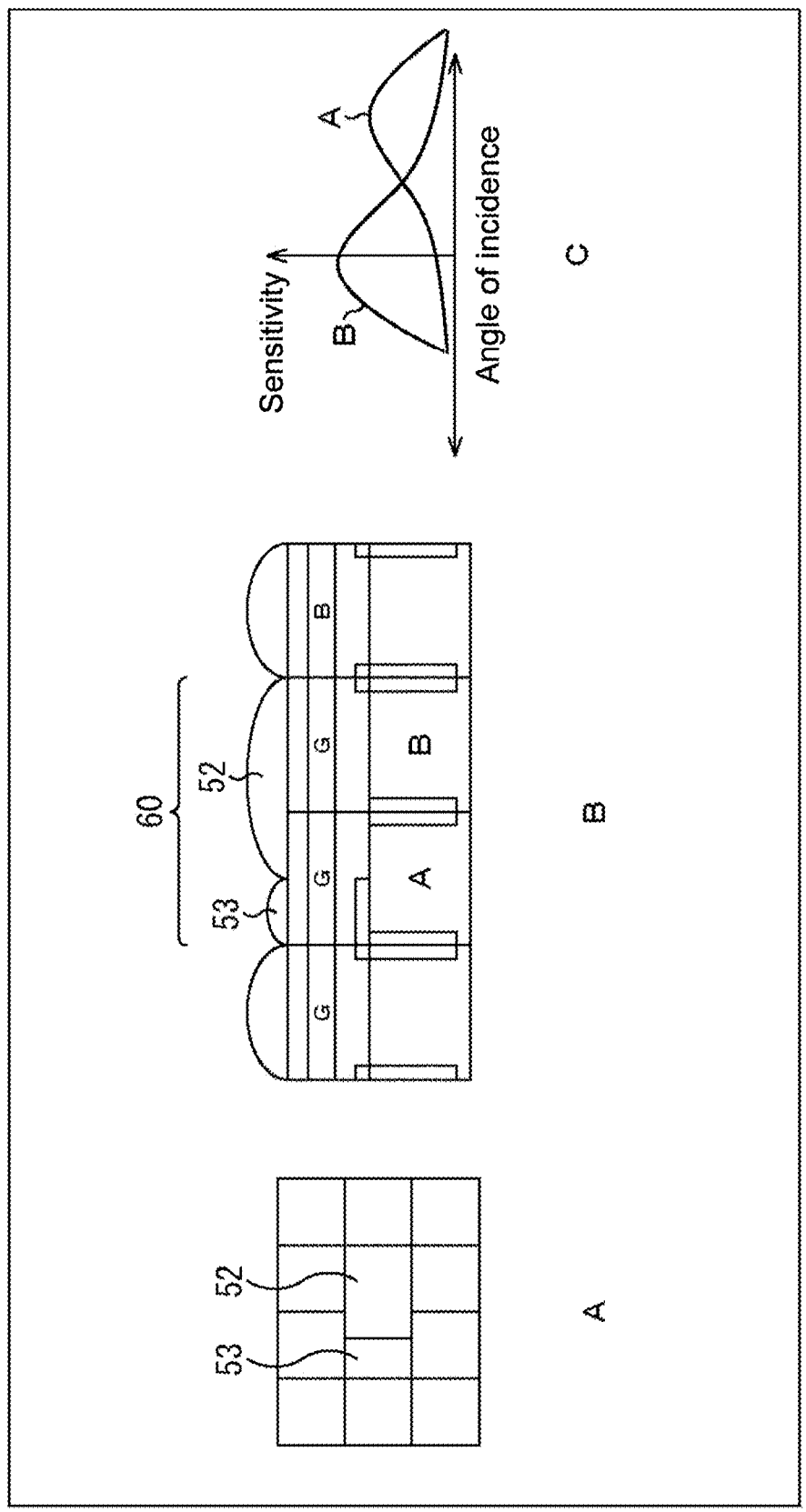
FIG. 12 A diagram for describing a relationship between a position of a dummy light-condensing element structure in the third configuration example of the phase-difference detection pixel and an amount of correction of pupil correction.

Next, FIGS. 10 to 12 are diagrams for describing a relationship between position(s) of the dummy light-condensing element structure(s) 53 in the phase-difference detection pixels 60 as the third configuration example shown in FIG. 8 and an amount of correction of pupil correction. Note that A of each of the figures shows a top view of the shared on-chip lens 52 and the dummy light-condensing element structure(s) 53 and the individual on-chip lenses 31 of the adjacent normal pixels 30, B of each of the figures shows a cross-sectional view, and C of each of the figures shows a relationship of device sensitivity to an angle of incidence of incident light at each phase-difference detection pixel.

FIG. 10 shows a case where a center of a shared on-chip lens 52 that covers adjacent phase-difference detection pixels 60A and 60B is formed at a position shifted to the phase-difference detection pixel 60A and a dummy light-condensing element structure 53 is formed between the shared on-chip lens 52 and an individual on-chip lens 31 of a normal pixel 30 adjacent to the phase-difference detection pixel 60B on the right-hand side in the figure. In this case, with respect to light in a perpendicular direction (angle of incidence of 0), the phase-difference detection pixel 60A has higher sensitivity than the phase-difference detection pixel 60B. As a result, with respect to light at the angle of incidence closer to the perpendicular direction, the phase-difference detection pixel 60A has higher sensitivity. Thus, it is possible to realize a pair of phase-difference detection pixels (phase-difference detection pixels 60A and 60B) having such an angle response that the phase-difference detection pixel 60B has relatively higher sensitivity to incident light from the left-hand side in the figure in an oblique direction.

FIG. 11 shows a case where a center of a shared on-chip lens 52 that covers adjacent phase-difference detection pixels 60A and 60B is formed at a position made coinciding with a center of both the pixels and dummy light-condensing element structures 53 are formed between the shared on-chip lens 52 and individual on-chip lenses 31 of normal pixels 30 respectively adjacent to the phase-difference detection pixels 60A and 60B. In this case, with respect to light in the perpendicular direction (angle of incidence of 0), the phase-difference detection pixels 60A and 60B have equal sensitivity. As a result, with respect to light at the angle of incidence closer to the perpendicular direction, the phase-difference detection pixel 60A has higher sensitivity. Thus, with respect to incident light in left and right oblique directions, it is possible to realize a pair of phase-difference detection pixels (phase-difference detection pixels 60A and 60B) that has an angle response symmetric with respect to the angle of incidence of 0 that is a reference.

FIG. 12 shows a case where a center of a shared on-chip lens 52 that covers adjacent phase-difference detection pixels 60A and 60B is formed at a position shifted to the phase-difference detection pixel 60B and a dummy light-condensing element structure 53 is formed between the shared on-chip lens 52 and an individual on-chip lens 31 of a normal pixel 30 adjacent to the phase-difference detection pixel 60A on the left-hand side in the figure. In this case, with respect to light in the perpendicular direction (angle of incidence of 0), the phase-difference detection pixel 60B has higher sensitivity than the phase-difference detection pixel 60A. As a result, with respect to light at the angle of incidence closer to the perpendicular direction, the phase-difference detection pixel 60B has higher sensitivity. Thus, it is possible to realize a pair of phase-difference detection pixels (phase-difference detection pixels 60A and 60B) having such an angle response that the phase-difference detection pixel 60A has relatively higher sensitivity to incident light from the right-hand side in the figure in the oblique direction.

By arranging the pair of phase-difference detection pixels shown in FIGS. 10 to 12 at the suitable positions in the solid-state image pickup device, it is possible to realize a solid-state image pickup device that is also adaptable for a zoom lens having a wide CRA range and the like.

<Modified Example of Third Configuration Example of the Phase-Difference Detection Pixel in Solid-State Image Pickup Device to Which Present Disclosure is Applied>

Figure 13:
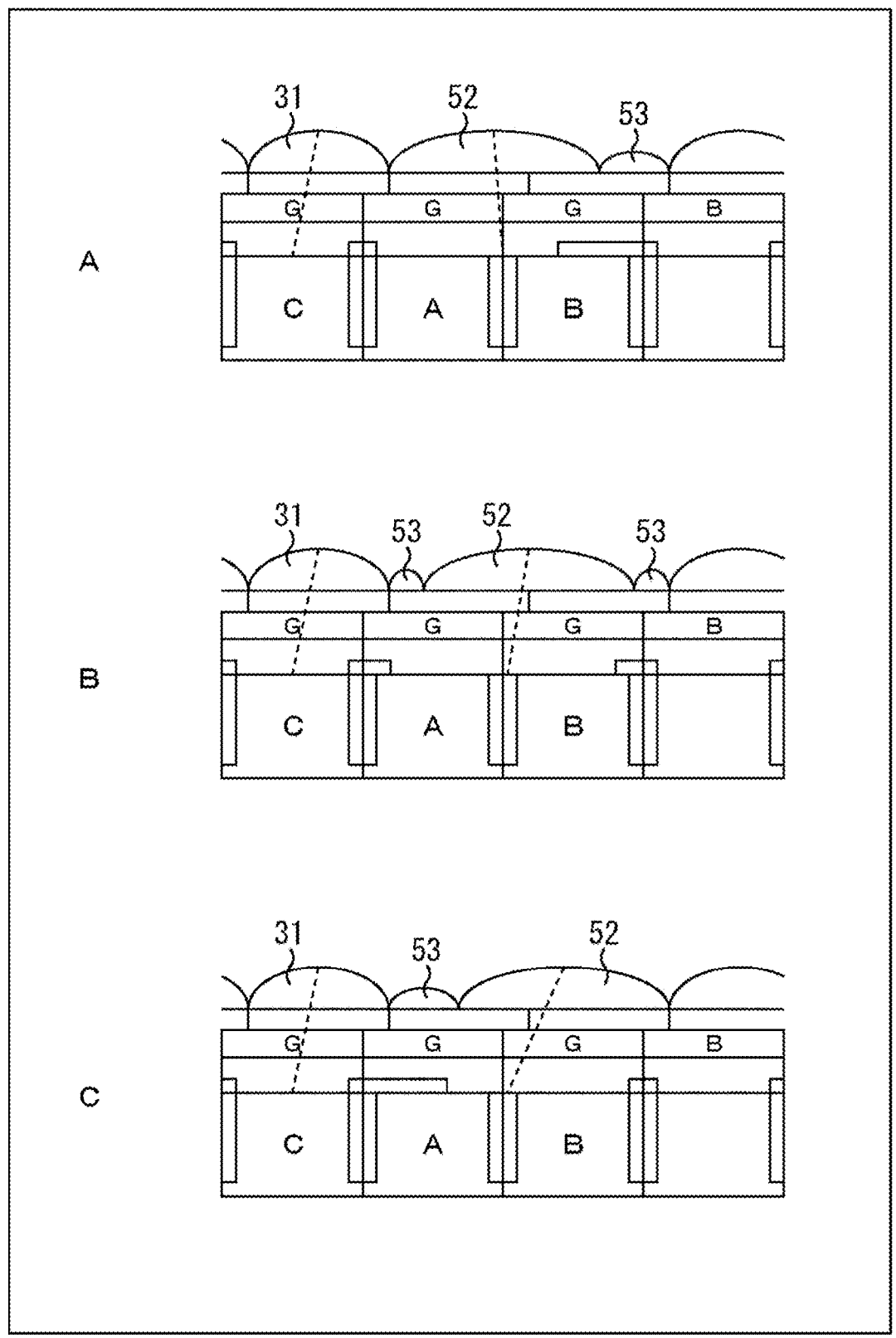
FIG. 13 A cross-sectional view showing a modified example of the third configuration example of the phase-difference detection pixel.

Next, FIG. 13 shows modified examples of the phase-difference detection pixels 60 as the third configuration example shown in B of FIG. 10 to B of FIG. 12. Specifically, the shared on-chip lens 52 and the dummy light-condensing element structure(s) 53 that cover the phase-difference detection pixels 60A and 60B are formed shifted so as to cover also the adjacent normal pixels 30 and the individual on-chip lenses 31 of the adjacent normal pixels 30 are also formed shifted correspondingly.

In the modified example of A of FIG. 13, the individual on-chip lenses 31, the shared on-chip lens 52, and the dummy light-condensing element structure 53 are formed shifted to the right-hand side in the figure from the state shown in B of FIG. 10. In this case, an individual on-chip lens 31 of a normal pixel 30C is decentered to the right-hand side and pupil correction thereof can be designed to be equivalent to that of main light beams of a lens optical system. On the other hand, regarding the phase-difference detection pixels 60A and 60B, the dummy light-condensing element structure 53 is formed on the right-hand side thereof, and hence a phase difference becomes 0 with respect to light from the left-hand side relatively or outputs of the phase-difference detection pixels 60A and 60B can be made equal.

In the modified example of B of FIG. 13, the individual on-chip lenses 31, the shared on-chip lens 52, and the dummy light-condensing element structures 53 are formed shifted to the right-hand side in the figure from the state shown in B of FIG. 11. In this case, the individual on-chip lens 31 of the normal pixel 30C is decentered to the right-hand side and pupil correction thereof can be designed to be equivalent to that of main light beams of a lens optical system. On the other hand, regarding the phase-difference detection pixels 60A and 60B, the dummy light-condensing element structures 53 are formed equally on the left- and right-hand sides, and hence the outputs of the phase-difference detection pixels 60A and 60B can be made equal at an angle equivalent to a direction of such an angle of incidence that the sensitivity becomes maximum at the normal pixel 30C.

In the modified example of C of FIG. 13, the individual on-chip lenses 31, the shared on-chip lens 52, and the dummy light-condensing element structure 53 are formed shifted to the right-hand side in the figure from the state shown in B of FIG. 12. In this case, the individual on-chip lens 31 of the normal pixel 30C is decentered to the right-hand side and pupil correction thereof can be designed to be equivalent to that of main light beams of a lens optical system. On the other hand, regarding the phase-difference detection pixels 60A and 60B, the dummy light-condensing element structure 53 is formed on the left-hand side thereof, and hence the phase difference becomes 0 with respect to light from the right-hand side relatively or the outputs of the phase-difference detection pixels 60A and 60B can be made equal.

As shown in FIG. 13, if the amount of correction of pupil correction between the normal pixel 30 and the phase-difference detection pixel 60 is designed to be a different level by changing the size, width, and arrangement of the dummy light-condensing element structure(s) 53, high-accurate phase-difference detection becomes possible even in the case where a main-light beam angle largely varies in a manner that depends on a focal distance like an optical zoom lens, for example.

<Fourth Configuration Example of Phase-Difference Detection Pixel in Solid-State Image Pickup Device to Which Present Disclosure is Applied>

Figure 14:
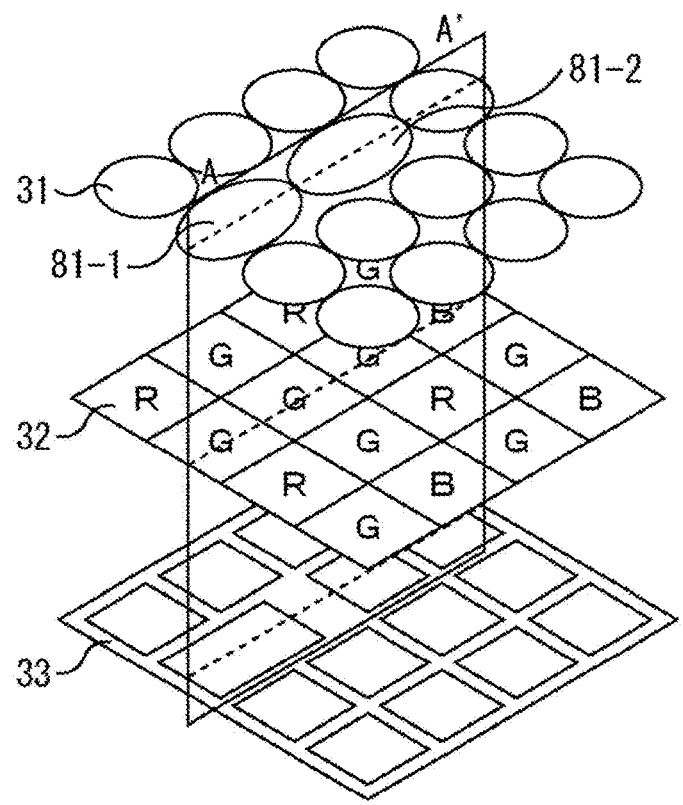
FIG. 14 A perspective view showing a fourth configuration example of the phase-difference detection pixel in the solid-state image pickup device to which the present disclosure is applied.
Figure 15:
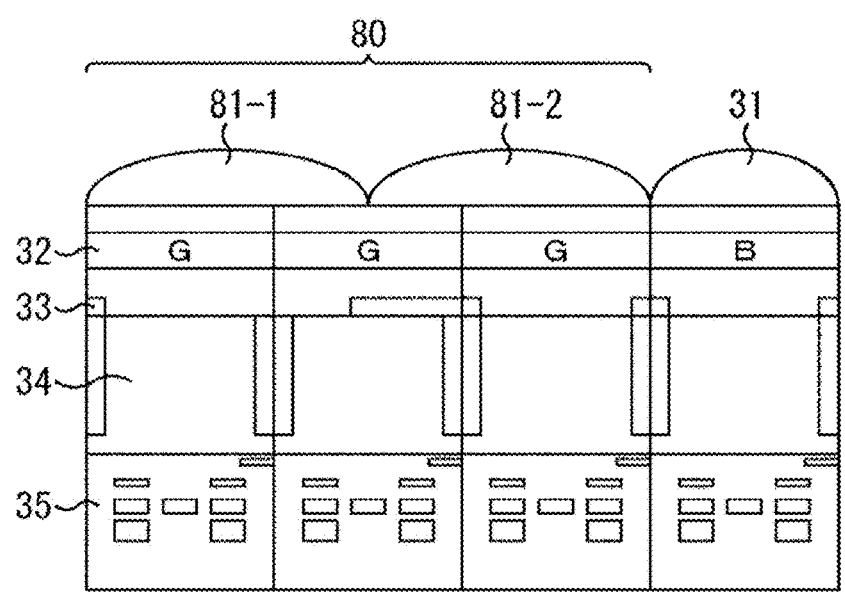
FIG. 15 A cross-sectional view corresponding to FIG. 14.

Next, a fourth configuration example of the phase-difference detection pixel in the solid-state image pickup device to which the present disclosure is applied will be described. FIG. 14 is a schematic perspective view extracting and showing a range of 16 (=4*4) pixels in the solid-state image pickup device to which the present disclosure is applied. Three pixels of them are phase-difference detection pixels 80 as a fourth configuration example. Other 13 pixels are normal pixels 30. FIG. 15 is a schematic sectional view taken along A-A' of FIG. 14. In the figure, the three pixels on the left-hand side are the phase-difference detection pixels 80.

The phase-difference detection pixels 80 include shared on-chip lenses 81, a color filter layer 32, inter-pixel light-shielding structures 33, photoelectric converters 34, and a signal wiring layer 35 in order from an upper surface side (incident surface side).

Figure 16:
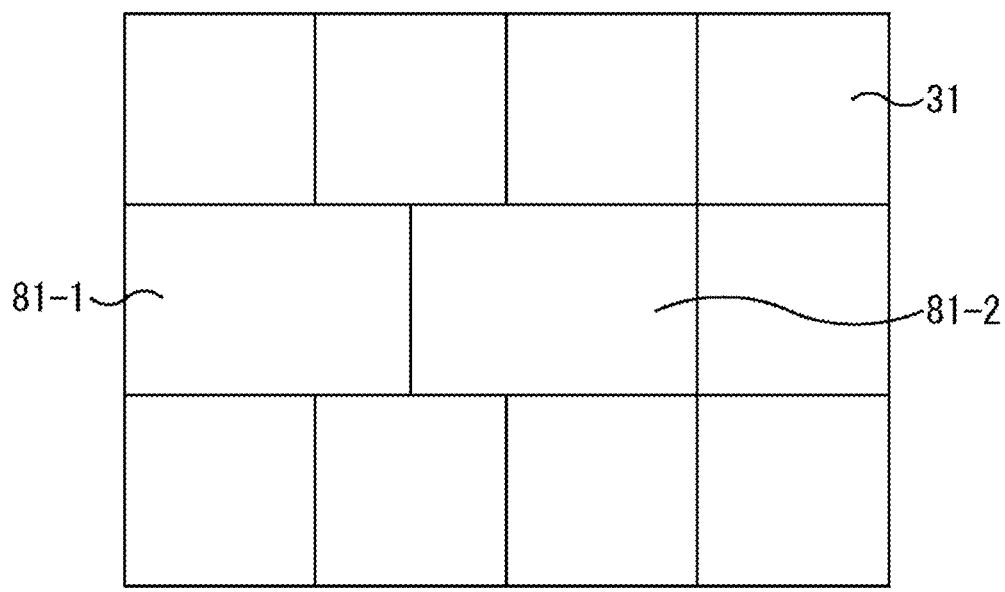

FIG. 16 shows a top view of the shared on-chip lenses 81. As shown in the figure, the shared on-chip lenses 81 are formed of two shared on-chip lenses 81-1 and 81-2 to cover the three adjacent phase-difference detection pixels 80. That is, the fourth configuration example shown in FIGS. 14 and 15 has a configuration in which the three phase-difference detection pixels 80 share the two shared on-chip lenses 81-1 and 81-2.

Note that approximately a half of a pixel opening of a central phase-difference detection pixel 80 of the three phase-difference detection pixels 80 that share the two shared on-chip lenses 81-1 and 81-2 is covered and shielded from light.

<Fifth Configuration Example of Phase-Difference Detection Pixel in Solid-State Image Pickup Device to Which Present Disclosure is Applied>

Figure 17:
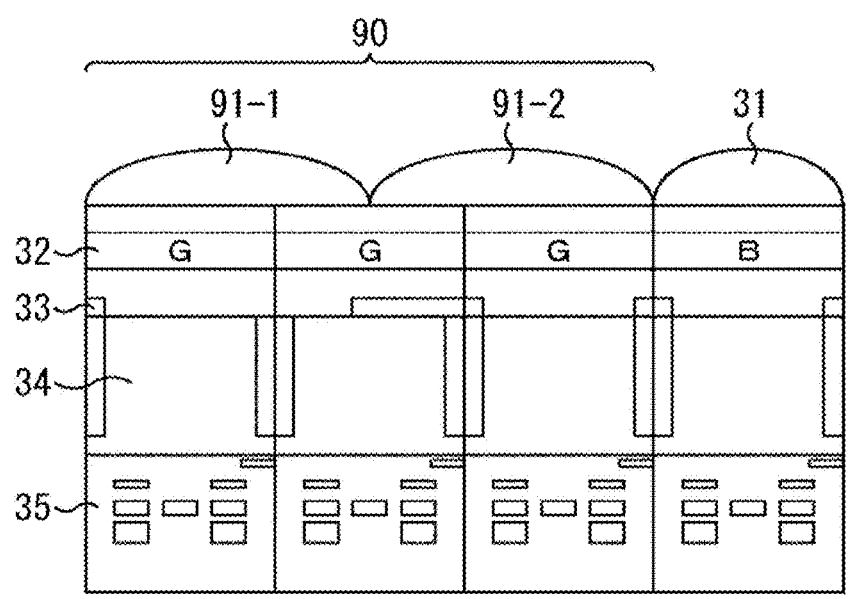
FIG. 17 A cross-sectional view showing a fifth configuration example of the phase-difference detection pixel in the solid-state image pickup device to which the present disclosure is applied.

Next, a fifth configuration example of the phase-difference detection pixel in the solid-state image pickup device to which the present disclosure is applied will be described. FIG. 17 is a schematic sectional view of four adjacent pixels in the solid-state image pickup device to which the present disclosure is applied. In the figure, three pixels on the left-hand side are phase-difference detection pixels 60 as the fifth configuration example.

Phase-difference detection pixels 90 as the fifth configuration example are obtained by replacing the shared on-chip lenses 81 of the phase-difference detection pixels 80 as the fourth configuration example by shared on-chip lenses 91. Like the shared on-chip lenses 81, the shared on-chip lenses 91 are formed of two shared on-chip lenses 91-1 and 91-2 to cover the three adjacent phase-difference detection pixels 90.

Figure 18:
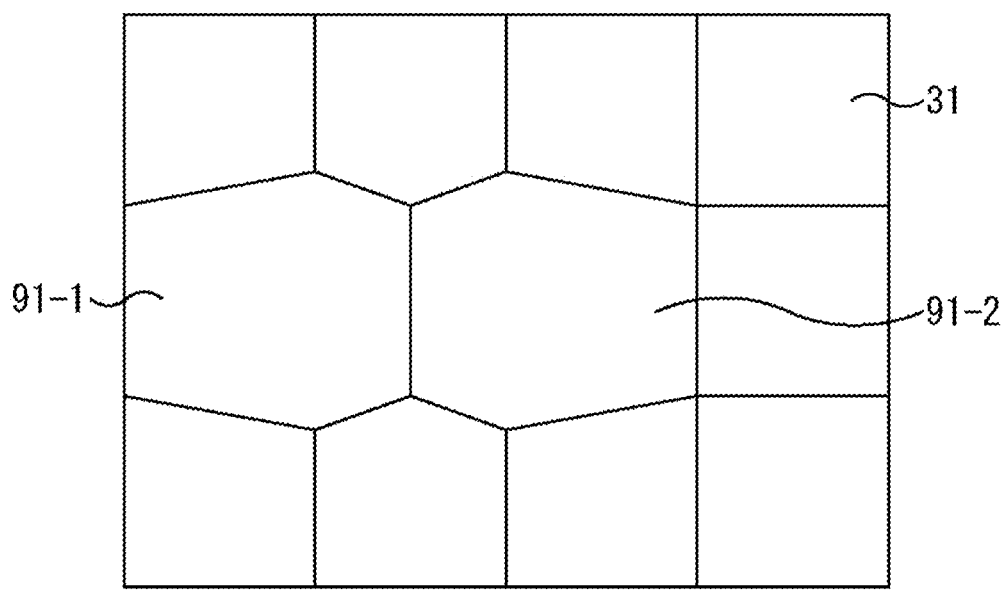

FIG. 18 shows a top view of the two shared on-chip lenses 91-1 and 91-2 that cover the three phase-difference detection pixels 90 and individual on-chip lenses 31 of adjacent normal pixels 30.

In the case where the shared on-chip lenses 91 are formed using a manufacturing method similar to that of the individual on-chip lenses 31, the individual on-chip lenses 31 are tessellated having substantially no gaps between adjacent pixels and the shapes thereof are approximately rectangular. On the other hand, the shape of the shared on-chip lens 91 is approximately hexagonal. With this, no gaps are formed between the normal pixels 30 and light-condensing element structures (on-chip lenses) of the phase-difference detection pixels 50. Thus, it becomes possible to increase the sensitivity of the phase-difference detection pixels.

<Relationship of Device Sensitivity to Angle of Incidence of Incident Light in Case where Three Adjacent Phase-Difference Detection Pixels are Covered with Two Shared On-Chip Lenses>

Figure 19:
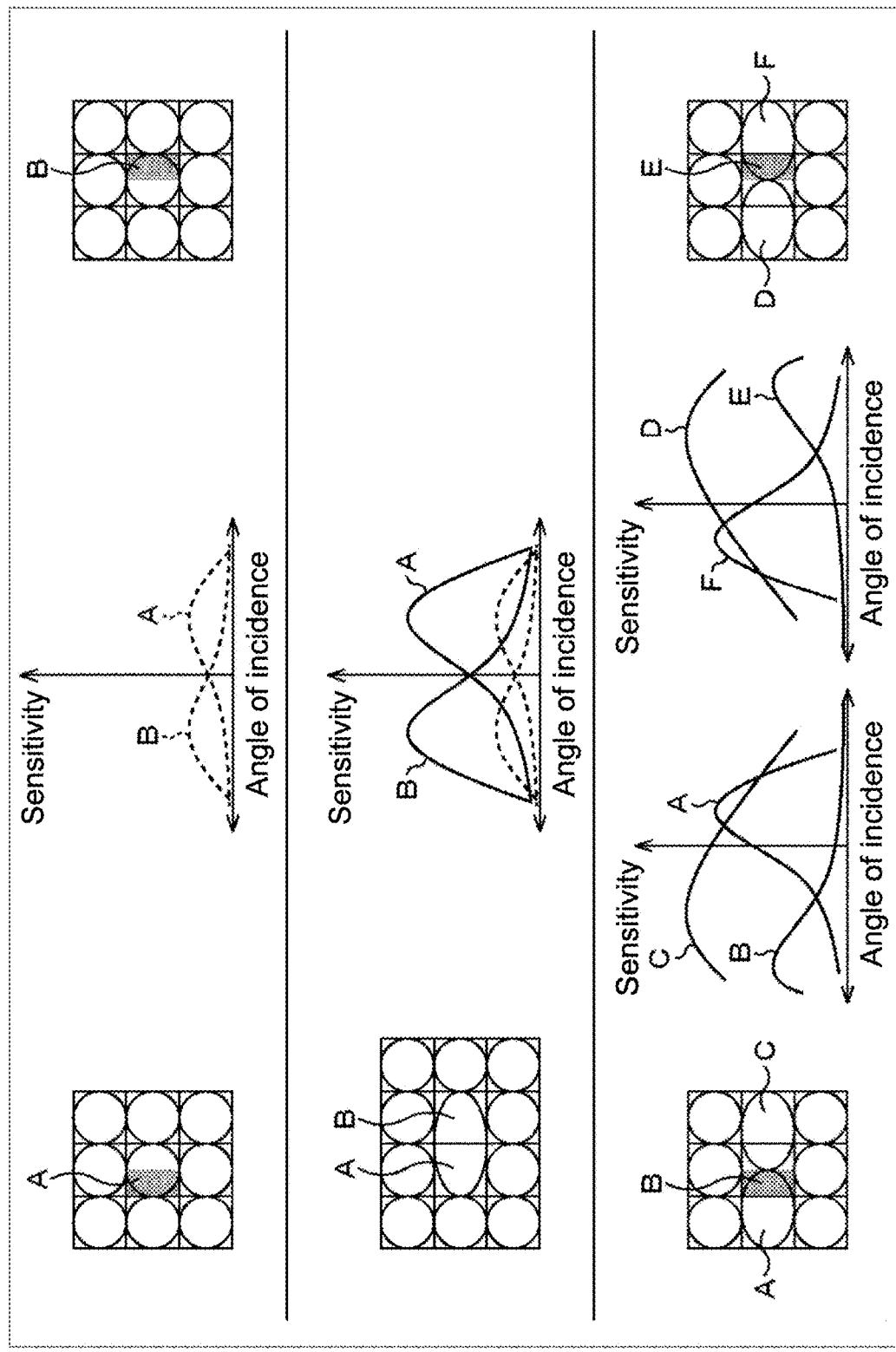
FIG. 19 A diagram for describing angle-of-incidence dependency of the device sensitivity of the first and fourth configuration examples.

FIG. 19 is for describing a relationship of device sensitivity to an angle of incidence of incident light in the case where the three adjacent phase-difference detection pixels are covered with the two shared on-chip lenses.

In the upper part of the figure, angle-of-incidence dependency of the device sensitivity of a phase-difference detection pixel A of a conventional type having a pixel opening whose left half is shielded from light and a phase-difference detection pixel B of the conventional type having a pixel opening whose right half is shielded from light is shown. The light-shielding is performed by using metal light-shielding films. The phase-difference detection pixel A has higher sensitivity to light at a positive incident angle. In contrast, the phase-difference detection pixel B has higher sensitivity to light entering at a negative angle. Phase-difference information used for AF is calculated on the basis of a difference between signal levels of both.

In the middle part of the figure, angle-of-incidence dependency of the device sensitivity of two phase-difference detection pixels 40A and 40B covered with one shared on-chip lens 41 as the first configuration example of the present disclosure. The phase-difference detection pixel 40A has higher sensitivity to light at a positive incident angle. In contrast, the phase-difference detection pixel 40B has higher sensitivity to light from light entering at a negative angle. Note that the dotted lines of the graph correspond to the conventional phase-difference detection pixels A and B shown in the upper part of the figure for the sake of comparison. As shown in the figure, in the phase-difference detection pixels 40A and 40B as the first configuration example, lowering of sensitivity due to light-shielding does not occur. Therefore, sensitivity higher than that of the conventional ones can be obtained at all incident angles.

In the lower part of the figure, angle-of-incidence dependency of the device sensitivity of three phase-difference detection pixels 80A, 80B, and 80C covered with the two shared on-chip lenses 81 as the fourth configuration example of the present disclosure and three phase-difference detection pixels 80D, 80E, and 80F covered with the two shared on-chip lenses 81 is shown. It should be noted that the phase-difference detection pixel 80B has a pixel opening whose left half is shielded from light and the phase-difference detection pixel 80E has a pixel opening whose right half is shielded from light.

The phase-difference detection pixel 80A has higher sensitivity to light at a positive incident angle. In contrast, the phase-difference detection pixel 80C has higher sensitivity to light at a negative incident angle. Further, the pixel opening of the phase-difference detection pixel 80B is shielded from light from the center to the left-hand side thereof. Therefore, the phase-difference detection pixel 80B has relatively lower sensitivity. In addition, the phase-difference detection pixel 80B has peak sensitivity to negative incidence larger than that of the phase-difference detection pixel 80C.

The phase-difference detection pixel 80F has higher sensitivity to light from a negative incident angle. In contrast, the phase-difference detection pixel 80D has higher sensitivity to a positive incident angle. Further, the pixel opening of the phase-difference detection pixel 80E is shielded from light from the center to the right-hand side thereof. Therefore, the phase-difference detection pixel 80E has relatively lower sensitivity. In addition, the phase-difference detection pixel 80E has peak sensitivity to positive incidence larger than that of the phase-difference detection pixel 80D.

Phase-difference information used for image-surface phase difference AF is calculated on the basis of a difference between signal levels of the plurality of phase-difference detection pixels 80. A range of angles at which each of the phase-difference detection pixels 80 has peak sensitivity is widened, and hence a phase difference can be detected with respect to light of a wide main-light beam range.

<Variations of Pixel Array>

Figure 20:
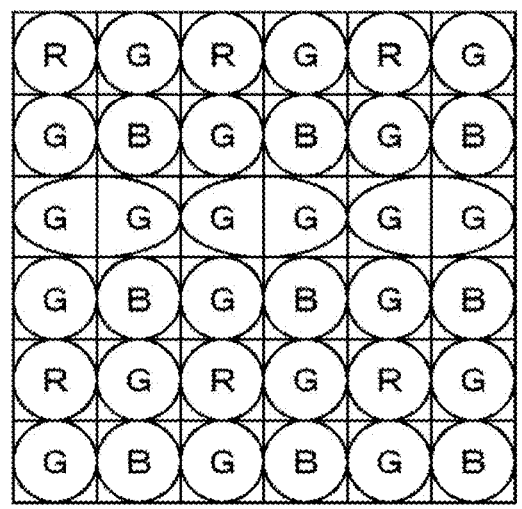
FIG. 20 A diagram showing a variation of the arrangement of phase-difference detection pixels.

FIG. 20 shows an arrangement example of the phase-difference detection pixels 40 in the solid-state image pickup device to which the present disclosure is applied. It should be noted that the figure extracts a pixel range of 6*6, 36 pixels of the solid-state image pickup device and each of R, G, and B of the figure represents the color of each pixel of the color filter layer 32. Note that the color arrangement of the color filter layer 32 in the normal pixels 30 other than the phase-difference detection pixels 40 is based on the Bayer array in which 4 (=2*2) pixels constitute a single unit. Note that the arrangement of respective color filters of R, G, and B within the unit is not limited to the one shown in the figure and can be changed. Or, also the configuration of the colors of the respective pixels of the color filter layer 32 is not limited to R, G, and B and can be changed. The same applies to the following figures.

In the arrangement example of the figure, the phase-difference detection pixels 40 are arranged in an entire third row from the upper side of the figure. The phase-difference detection pixels 40 of the same color (in this case, G) are covered with the shared on-chip lenses 41 for every two pixels.

By setting all the pixels in the one row to be the phase-difference detection pixels 40, both highly accurate, highly sensitive phase-difference detection and a high-resolution image due to the Bayer array can be realized.

Figure 21:
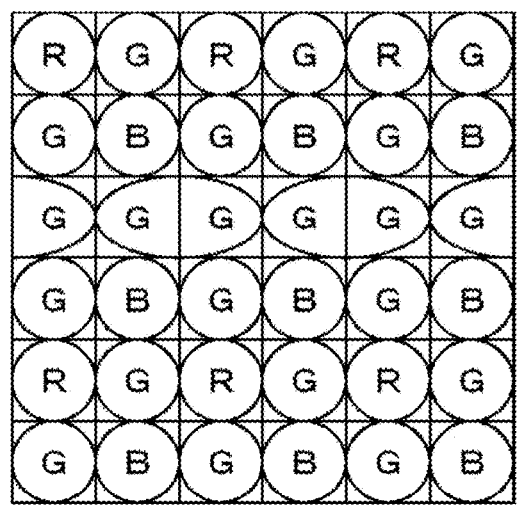
FIG. 21 A diagram showing a variation of the arrangement of phase-difference detection pixels.
Figure 22:
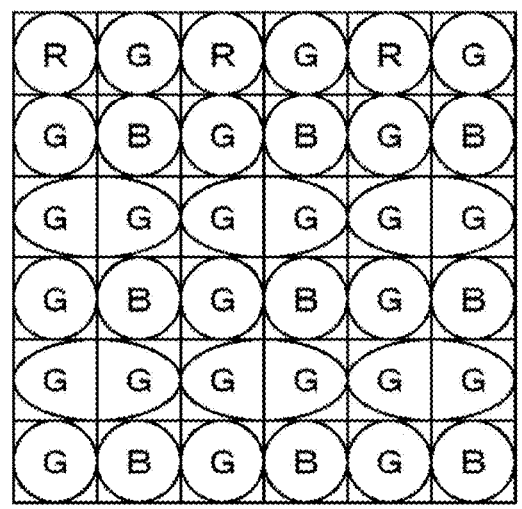
FIG. 22 A diagram showing a variation of the arrangement of phase-difference detection pixels.

FIG. 21 shows an arrangement example in which the phase-difference detection pixels 40 of the arrangement example of FIG. 20 are shifted by one column. It is favorable that the phase-difference detection pixels 40 whose phases are shifted by a semi-phase are mixed in one solid-state image pickup device as in the arrangement example of FIG. 20 and the arrangement example of FIG. 21. FIG. 22 is obtained by further arranging the phase-difference detection pixels 40 also in all pixels of a fifth row from the upper side of the figure, with respect to the arrangement example of FIG. 20. FIG. 22 shows an arrangement example assuming FD addition in 2*4-pixels. By employing an arrangement with which output signals of the phase-difference detection pixels of the same phase can be added for the FD addition, it is possible to realize both of highly accurate, highly sensitive phase-difference detection and a high-resolution image due to the Bayer array.

Figure 23:
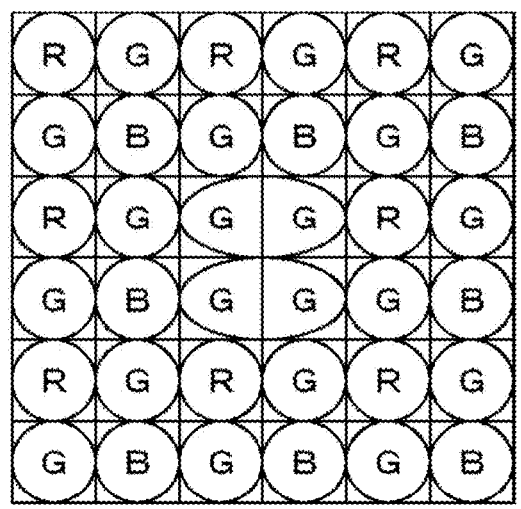
FIG. 23 A diagram showing a variation of the arrangement of phase-difference detection pixels.

FIG. 23 shows an arrangement example in which the phase-difference detection pixels 40 are arranged in 4 (=2*2) pixels at a center of the figure and the phase-difference detection pixels 40 of the same color (in this case, G) are covered with a shared on-chip lens 41 horizontally long for every two pixels.

Figure 24:
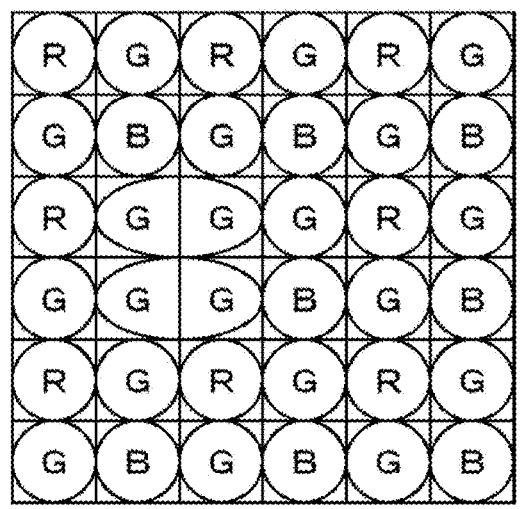
FIG. 24 A diagram showing a variation of the arrangement of phase-difference detection pixels.
Figure 25:
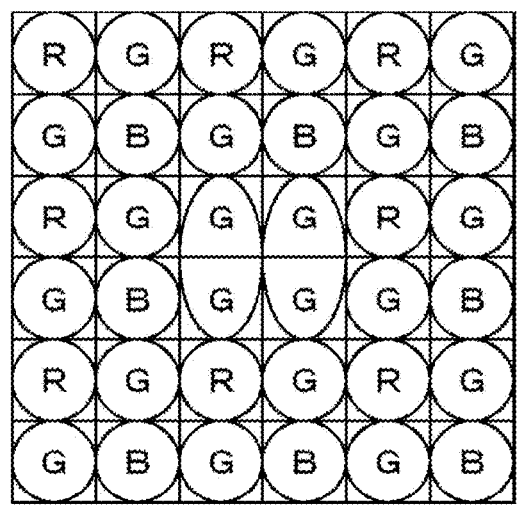
FIG. 25 A diagram showing a variation of the arrangement of phase-difference detection pixels.

FIG. 24 shows an arrangement example in which the phase-difference detection pixels 40 of the arrangement example of FIG. 23 are shifted by one column. It is favorable that the phase-difference detection pixels 40 whose phases are shifted by a semi-phase are mixed in one solid-state image pickup device as in the arrangement example of FIG. 23 and the arrangement example of FIG. 24. FIG. 25 shows an arrangement example in which the phase-difference detection pixels 40 are arranged in 4 (=2*2) pixels at a center of the figure and the phase-difference detection pixels 40 of the same color (in this case, G) are covered with shared on-chip lenses 41 vertically long for every two pixels.

Figure 26:
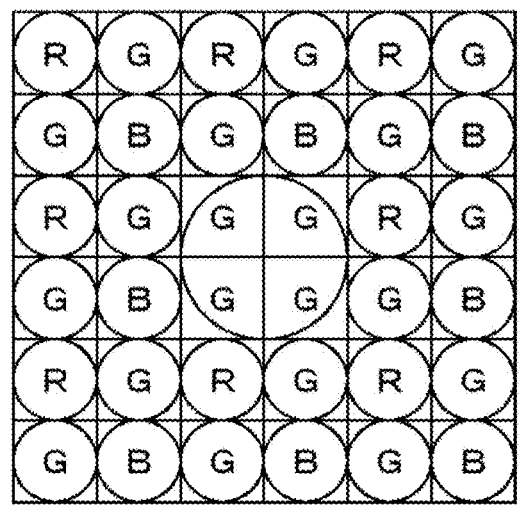
FIG. 26 A diagram showing a variation of the arrangement of phase-difference detection pixels.

FIG. 26 shows an arrangement example in which the phase-difference detection pixels 40 are arranged in 4 (=2*2) pixels at a center of the figure and four phase-difference detection pixels 40 of the same color (in this case, G) are covered with one shared on-chip lens 41.

Figure 27:
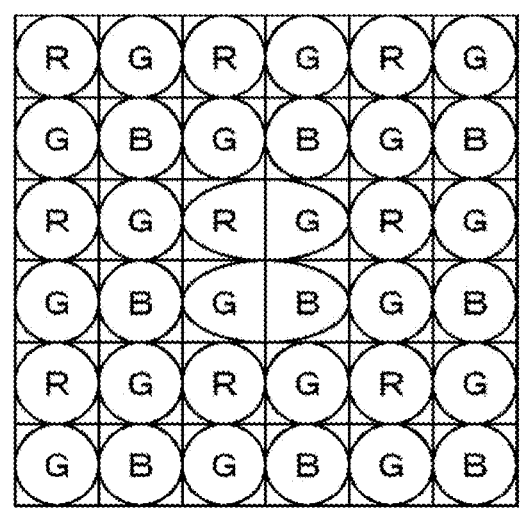
FIG. 27 A diagram showing a variation of the arrangement of phase-difference detection pixels.

FIG. 27 shows an arrangement example in which the phase-difference detection pixels 40 whose color arrangement is based on the Bayer array are arranged in 4 (=2*2) pixels at a center of the figure and the phase-difference detection pixels 40 of different colors (in this case, R and G, G and B) are covered with a shared on-chip lens 41 horizontally long for every two pixels.

Figure 28:
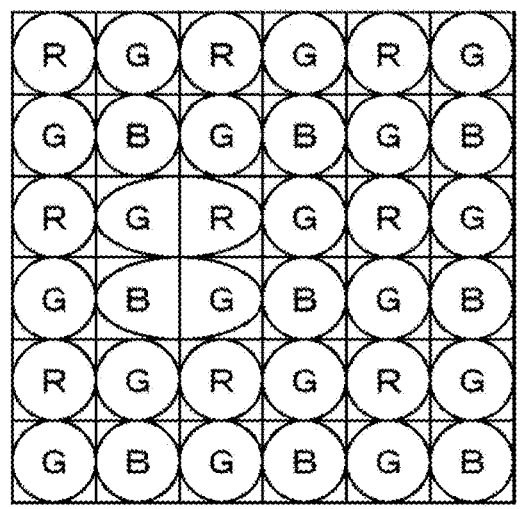
FIG. 28 A diagram showing a variation of the arrangement of phase-difference detection pixels.
Figure 29:
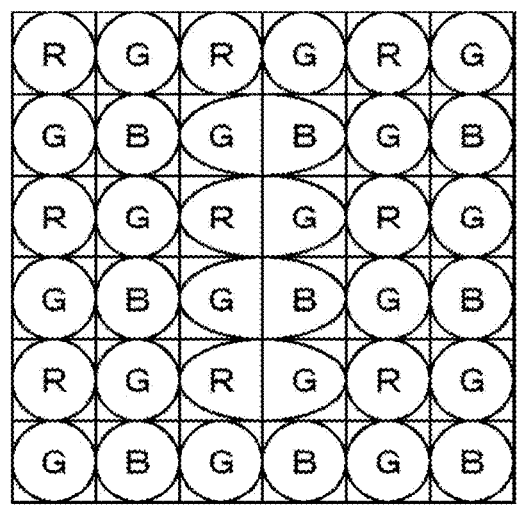
FIG. 29 A diagram showing a variation of the arrangement of phase-difference detection pixels.

FIG. 28 shows an arrangement example in which the phase-difference detection pixels 40 of the arrangement example of FIG. 27 are shifted by one column. Specifically, in this arrangement example, the phase-difference detection pixels 40 of different colors (in this case, G and R, B and G) are covered with a shared on-chip lens 41 horizontally long for every two pixels. It is favorable that the phase-difference detection pixels 40 whose phases are shifted by a semi-phase are mixed in one solid-state image pickup device as in the arrangement example of FIG. 27 and the arrangement example of FIG. 28. FIG. 29 shows an arrangement example in which the phase-difference detection pixels 40 whose color arrangement is based on the Bayer array are arranged in 8 (=2*4) pixels at a center of the figure, the phase-difference detection pixels 40 of different colors (in this case, G and B, R and G) are covered with the shared on-chip lens 41 horizontally long for every two pixels, and FD addition in 2*4-pixels is assumed.

Figure 30:
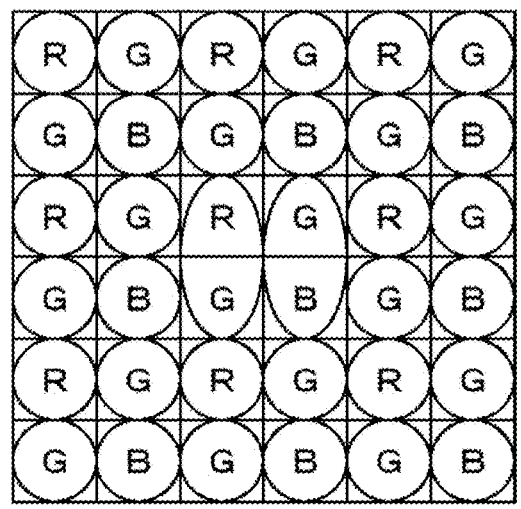
FIG. 30 A diagram showing a variation of the arrangement of phase-difference detection pixels.

FIG. 30 shows an arrangement example in which the phase-difference detection pixels 40 whose color arrangement is based on the Bayer array are arranged in 4 (=2*2) pixels at a center of the figure and the phase-difference detection pixels 40 of different colors (in this case, R and G, G and B) are covered with shared on-chip lenses 41 vertically long for every two pixels.

Figure 31:
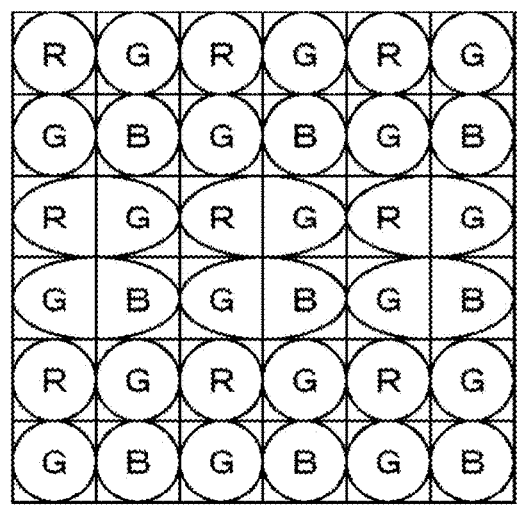
FIG. 31 A diagram showing a variation of the arrangement of phase-difference detection pixels.

FIG. 31 shows an arrangement example in which the phase-difference detection pixels 40 whose color arrangement is based on the Bayer array are arranged in all pixels in a third row and a fourth row from the upper side of the figure and the phase-difference detection pixels 40 of different colors (in this case, R and G, G and B) are covered with a shared on-chip lens 41 horizontally long for every two pixels.

Figure 32:
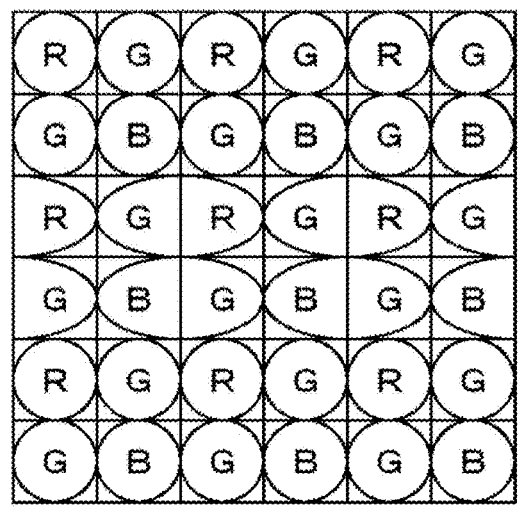
FIG. 32 A diagram showing a variation of the arrangement of phase-difference detection pixels.
Figure 33:
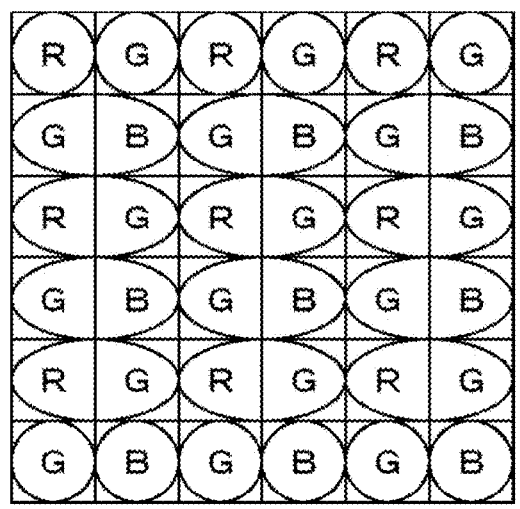
FIG. 33 A diagram showing a variation of the arrangement of phase-difference detection pixels.

FIG. 32 shows an arrangement example in which the phases of the phase-difference detection pixels 40 of the arrangement example of FIG. 31 are shifted by a semi-phase. It is favorable that the phase-difference detection pixels 40 whose phases are shifted by a semi-phase are mixed in one solid-state image pickup device as in the arrangement example of FIG. 31 and the arrangement example of FIG. 32. FIG. 33 shows an arrangement example in which the phase-difference detection pixels 40 whose color arrangement is based on the Bayer array are arranged in all pixels in second to fifth rows from the upper side of the figure, the phase-difference detection pixels 40 of different colors (in this case, G and B, R and G) are covered with a shared on-chip lens 41 horizontally long for every two pixels, and FD addition of 2*4-pixels is assumed.

Figure 34:
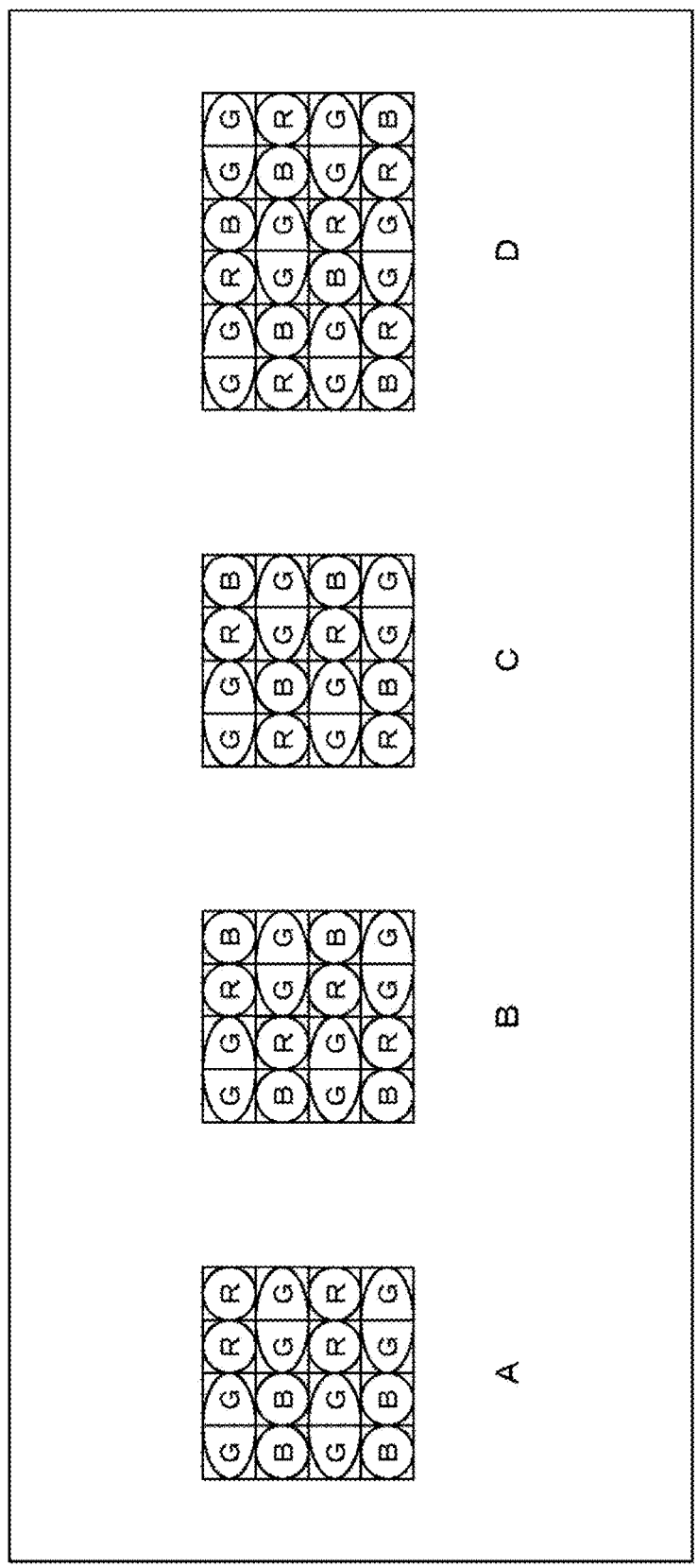
FIG. 34 A diagram showing a variation of the arrangement of phase-difference detection pixels.

FIG. 34 shows arrangement examples of the phase-difference detection pixels 40 in the solid-state image pickup device to which the present disclosure is applied. FIG. 34 extracts and shows 16 (=4*4) pixels or 24 (=6*4) pixels of the solid-state image pickup device.

In the arrangement example of A of the figure, regarding the phase-difference detection pixels 40, two pixels having selective sensitivity to G (covered with G-color filters) are covered with one shared on-chip lens 41 and arranged in a checkerboard pattern in such a manner that they are not adjacent to each other in each row. Regarding the normal pixels 30, two pixels having selective sensitivity to the same color (covered with color filters of same color) are arranged adjacent to each other in a row direction.

In the arrangement example of B of the figure, regarding the phase-difference detection pixels 40, two pixels having selective sensitivity to G are covered with one shared on-chip lens 41 and arranged in a checkerboard pattern in such a manner that they are not adjacent to each other in each row. Regarding the normal pixels 30, they are arranged in the order of R and B in an Nth row and they are arranged in the order of B and R in an N+1th row.

In the arrangement example of C of the figure, regarding the phase-difference detection pixels 40, two pixels having selective sensitivity to G are covered with one shared on-chip lens 41 and arranged in a checkerboard pattern in such a manner that they are not adjacent to each other in each row. Regarding the normal pixels 30, they are arranged in the order of R and B in each row.

In the arrangement example of D of the figure, regarding the phase-difference detection pixels 40, two pixels having selective sensitivity to G are covered with one shared on-chip lens 41 and arranged in a checkerboard pattern in such a manner that they are not adjacent to each other in each row. Regarding the normal pixels 30, R and B are present in all rows and columns. The same color is constantly arranged on both sides of two phase-difference detection pixels 40 that is paired.

Figure 35:
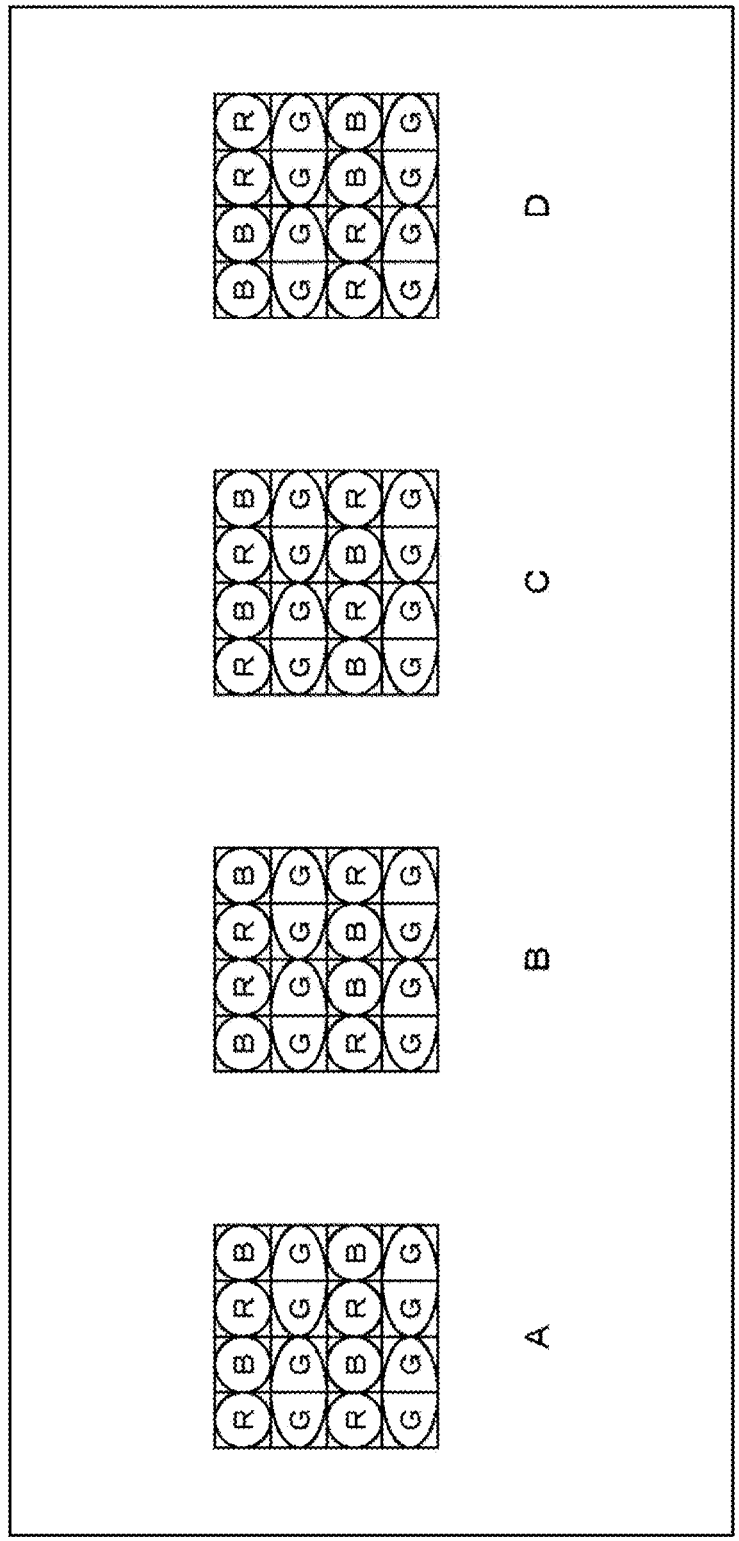
FIG. 35 A diagram showing a variation of the arrangement of phase-difference detection pixels.

FIG. 35 shows arrangement examples of the phase-difference detection pixels 40 in the solid-state image pickup device to which the present disclosure is applied. FIG. 35 extracts and shows 16 (=4*4) pixels of the solid-state image pickup device. In the arrangement examples shown in A of the figure to D of the figure, the phase-difference detection pixels 40 having selective sensitivity to G are continuously arranged in a horizontal (row) strip form and phases thereof are common among all rows.

In the case of A of the figure, regarding the normal pixels 30, as viewed in the row direction, they are arranged in such a manner that the arrangement of R and B of each row is identical and the same colors are not continuous.

In the case of B of the figure, regarding the normal pixels 30, as viewed in the row direction, they are arranged allowing the same colors to be continuous.

In the case of C of the figure, regarding the normal pixels 30, as viewed in the row direction, they are arranged in such a manner that the arrangement of R and B of each row is different and the same colors are not continuous.

In the case of D of the figure, the arrangement of the normal pixels is shifted from the arrangement example shown in B of the figure by one column.

Figure 36:
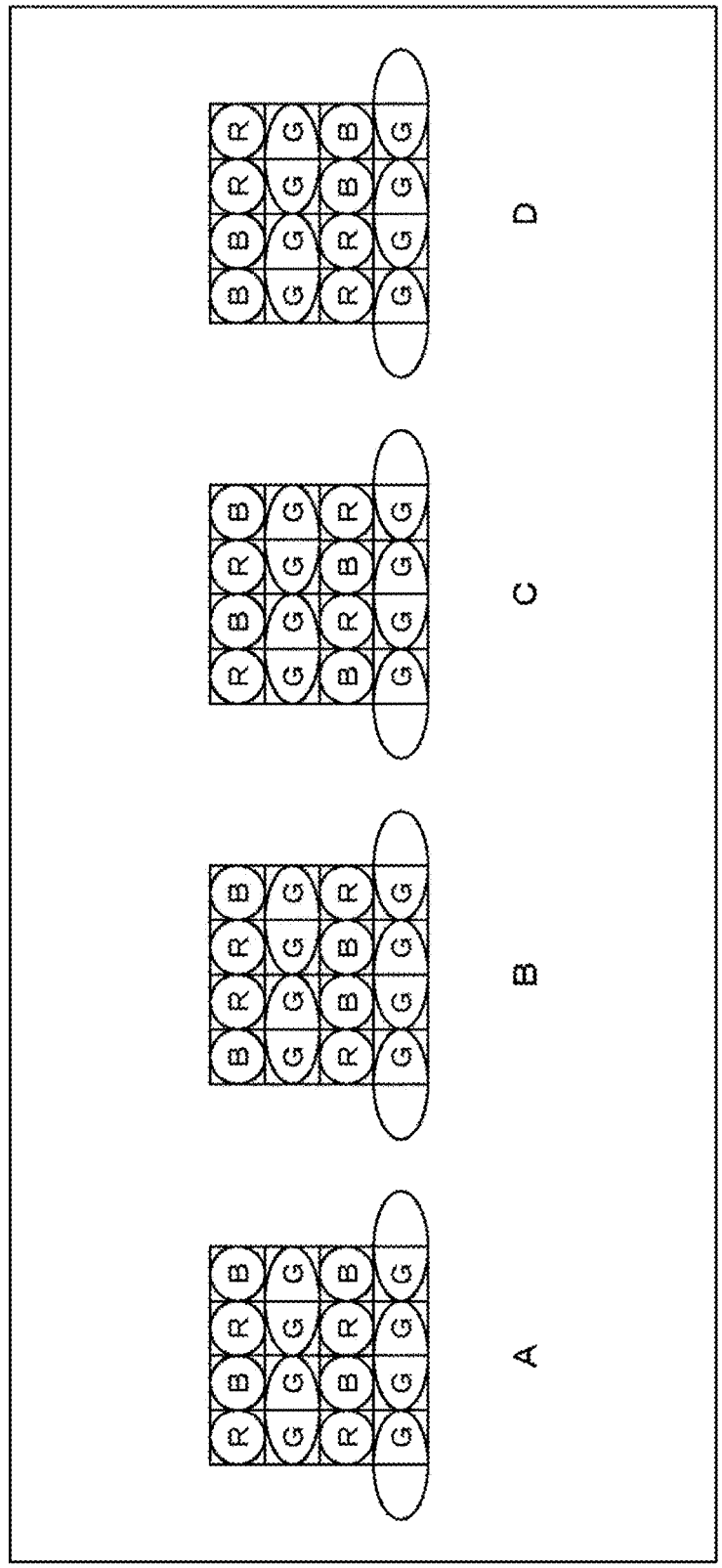
FIG. 36 A diagram showing a variation of the arrangement of phase-difference detection pixels.

FIG. 36 shows arrangement examples of the phase-difference detection pixels 40 in the solid-state image pickup device to which the present disclosure is applied. FIG. 36 extracts and shows 16 (=4*4) pixels of the solid-state image pickup device. In the arrangement examples shown in A of the figure to D of the figure, the phase-difference detection pixels 40 having selective sensitivity to G are continuously arranged in a horizontal (row) strip form and arranged in such a manner that phases thereof are shifted by a semi-phase in each row.

In the case of A of the figure, regarding the normal pixels 30, as viewed in the row direction, they are arranged in such a manner that the arrangement of R and B of each row is identical and the same colors are not continuous.

In the case of B of the figure, regarding the normal pixels 30, as viewed in the row direction, they are arranged allowing the same colors to be continuous.

In the case of C of the figure, regarding the normal pixels 30, as viewed in the row direction, they are arranged in such a manner that the arrangement of R and B of each row is different and the same colors are not continuous.

In the case of D of the figure, the arrangement of the normal pixels is shifted from the arrangement example shown in B of the figure by one column.

Figure 37:
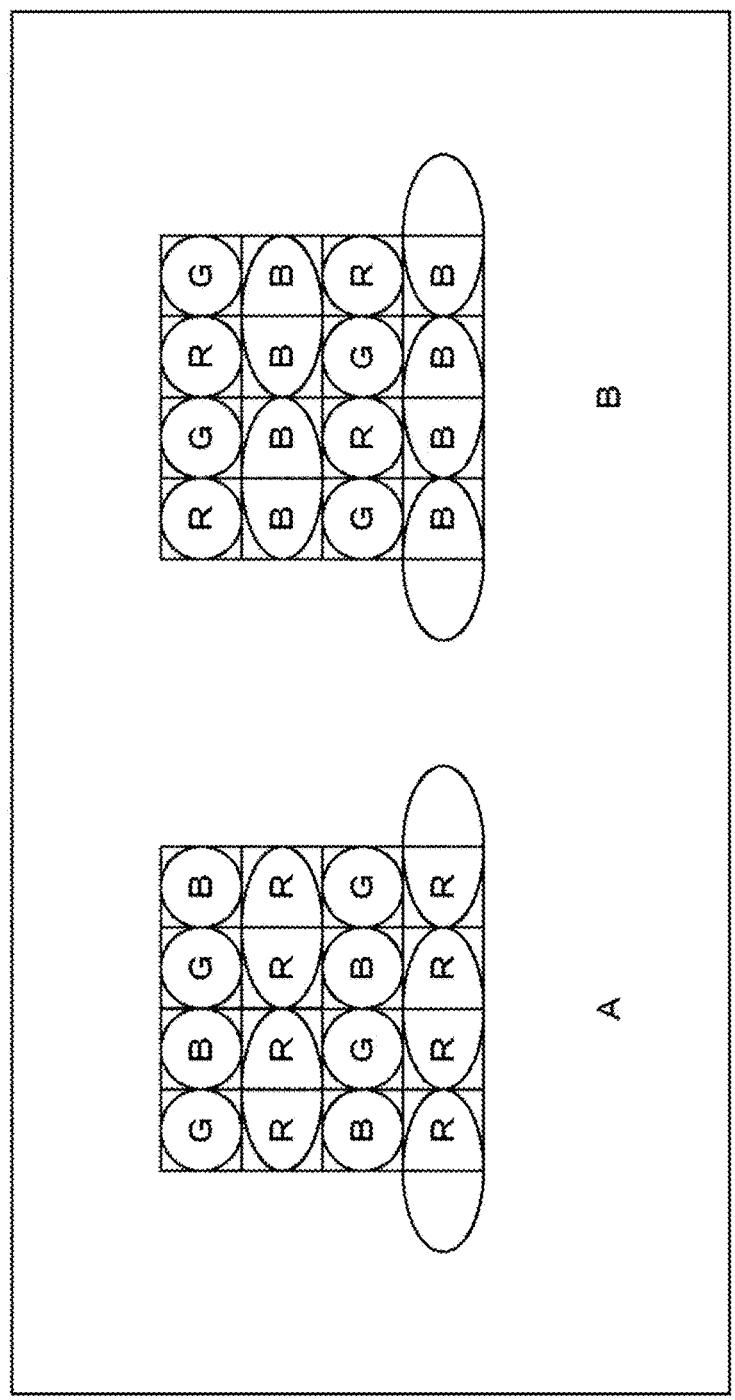
FIG. 37 A diagram showing a variation of the arrangement of phase-difference detection pixels.

FIG. 37 shows arrangement examples of the phase-difference detection pixels 40 in the solid-state image pickup device to which the present disclosure is applied. FIG. 37 extracts and shows 16 (=4*4) pixels of the solid-state image pickup device. It should be noted that, in the arrangement examples of the figure, the color of the color filter layer of the phase-difference detection pixels 40 is set to be R or B.

That is, in the arrangement example shown in A of the figure, the phase-difference detection pixels 40 having selective sensitivity to R are continuously arranged in a horizontal stripe form and arranged in such a manner that phases thereof are shifted by a semi-phase in each row. Regarding the normal pixels 30, as viewed in the row direction, they are arranged in such a manner that the arrangement of G and B in each row is identical and the same colors are not continuous.

In the arrangement example shown in B of the figure, the phase-difference detection pixels 40 having selective sensitivity to B are continuously arranged in a horizontal stripe form and arranged in such a manner that phases thereof are shifted by a semi-phase in each row. Regarding the normal pixels 30, as viewed in the row direction, they are arranged in such a manner that the arrangement of R and G in each row is identical and the same colors are not continuous.

As shown in the figure, the color of the color filter layer of the phase-difference detection pixels 40 is not limited to G and may be R or B. In this case, the sensitivity is approximately ½ in comparison with a case where the color of the color filters that cover the phase-difference detection pixels 40 is set to be G. However, the area of the shared on-chip lens 41 that covers the phase-difference detection pixels 40 is twice as large as that of the individual on-chip lens 31 that covers the normal pixel 30. Therefore, outputs thereof are equal and the sensitivity ratio becomes favorable.

Figure 38:
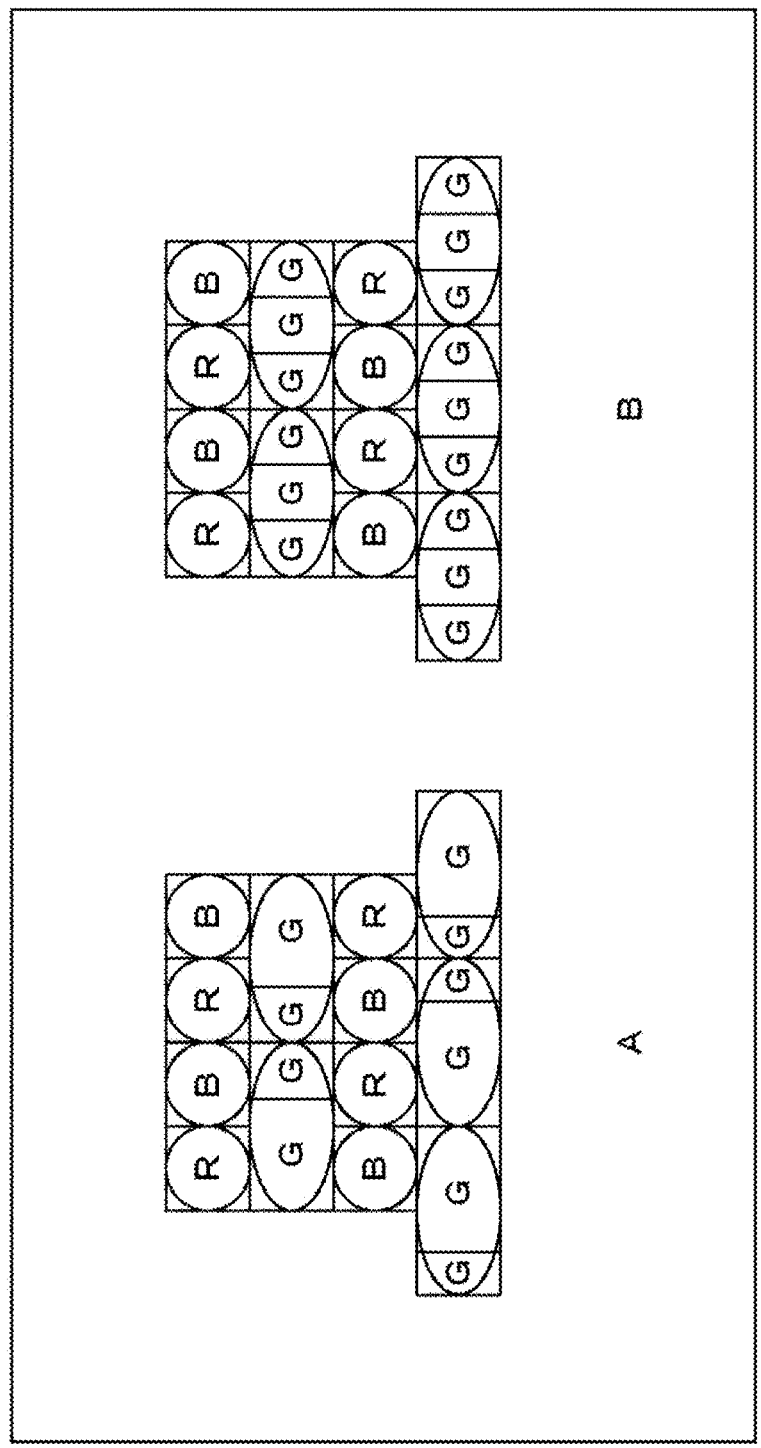
FIG. 38 A diagram showing a variation of the arrangement of phase-difference detection pixels.

FIG. 38 is a modification of the configuration of the phase difference detection images 40 of the arrangement example shown in A of FIG. 36. A of the figure shows one obtained by dividing the region of the phase difference detection images 40 corresponding to two pixels into two regions unevenly (1:3). B of the figure shows one obtained by dividing the region of the phase difference detection images 40 corresponding to two pixels into three regions evenly for multiview. As shown in the figure, if the region of the phase difference detection images 40 corresponding to two pixels is suitably divided into a plurality of regions at a ratio different from 1:1, improvement of an oblique incidence characteristic can be achieved. Note that the modified example shown in FIG. 38 may be further modified and the color of the color filters that cover the phase-difference detection pixels 40 may be set to be R or B as shown in FIG. 37.

Figure 39:
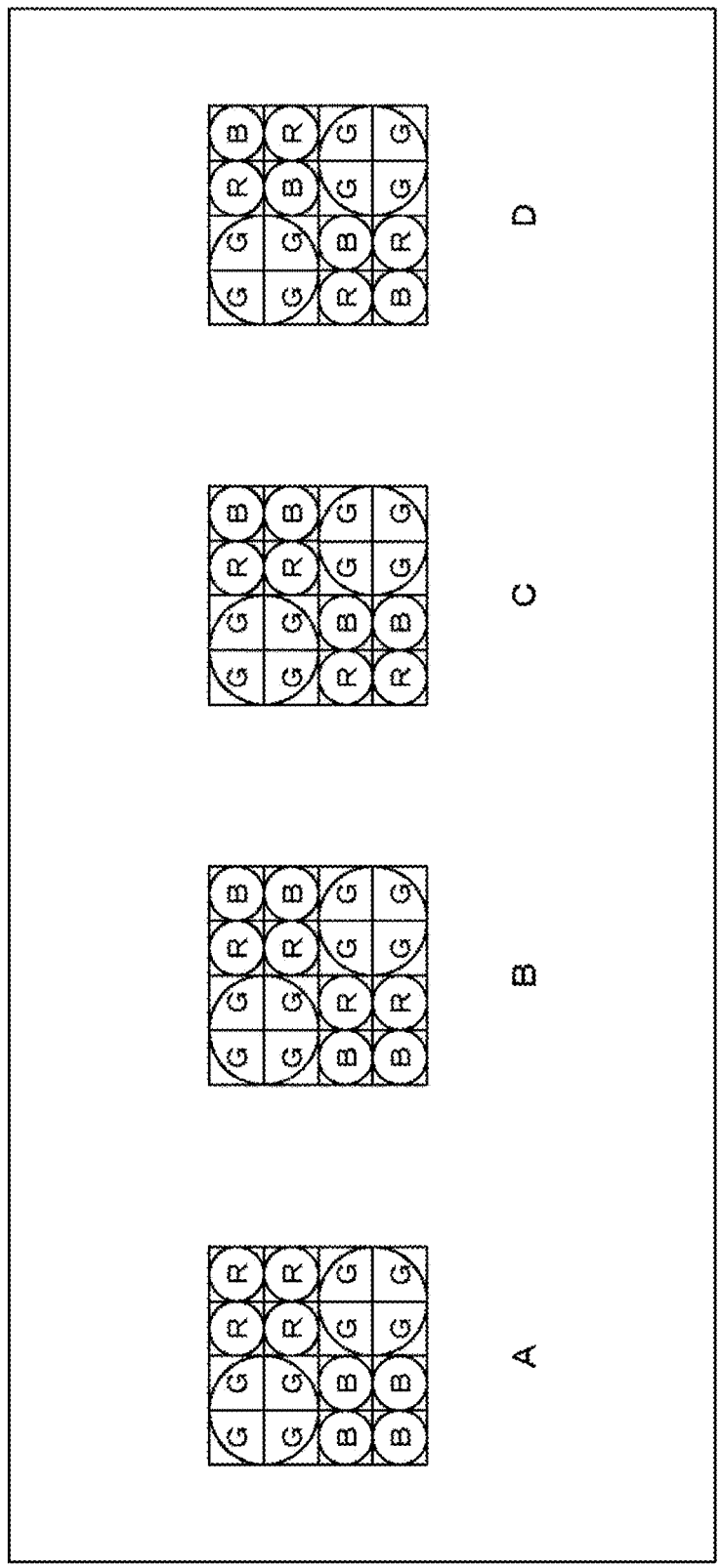
FIG. 39 A diagram showing a variation of the arrangement of phase-difference detection pixels.

FIG. 39 shows arrangement examples of the phase-difference detection pixels 40 in the solid-state image pickup device to which the present disclosure is applied. FIG. 39 extracts and shows 16 (=4*4) pixels of the solid-state image pickup device. In the arrangement examples shown in A of the figure to D of the figure, regarding the phase-difference detection pixels 40, four pixels having selective sensitivity to G are covered with one shared on-chip lens 41. Regarding the normal pixels 30, they have selective sensitivity to R or B and each of those pixels is covered with the individual on-chip lens 31.

In the case of A of the figure, only the normal pixels 30 of R or only the normal pixels 30 of B are arranged in a 2*2-pixel region other than the phase-difference detection pixels 40 of G.

In the case of B of the figure, in the 2*2-pixel region other than the phase-difference detection pixels 40 of G, normal pixels 30 having the same color of R or B are arranged adjacent to each other in a column direction. It should be noted that the arrangement of the normal pixels 30 of R and B in each 2*2-pixel region is different.

In the case of C of the figure, in the 2*2-pixel region other than the phase-difference detection pixels 40 of G, the same-color normal pixels 30 of R or B are arranged adjacent to each other in the column direction. It should be noted that the arrangement of the normal pixels 30 of R and B in each 2*2-pixel region is common.

In the case of D of the figure, in the 2*2-pixel region other than the phase-difference detection pixels 40 of G, the same-color normal pixels 30 of R or B are arranged adjacent to each other in the oblique direction. It should be noted that the arrangement of the normal pixels 30 of R and B in each 2*2-pixel region is common.

Figure 40:
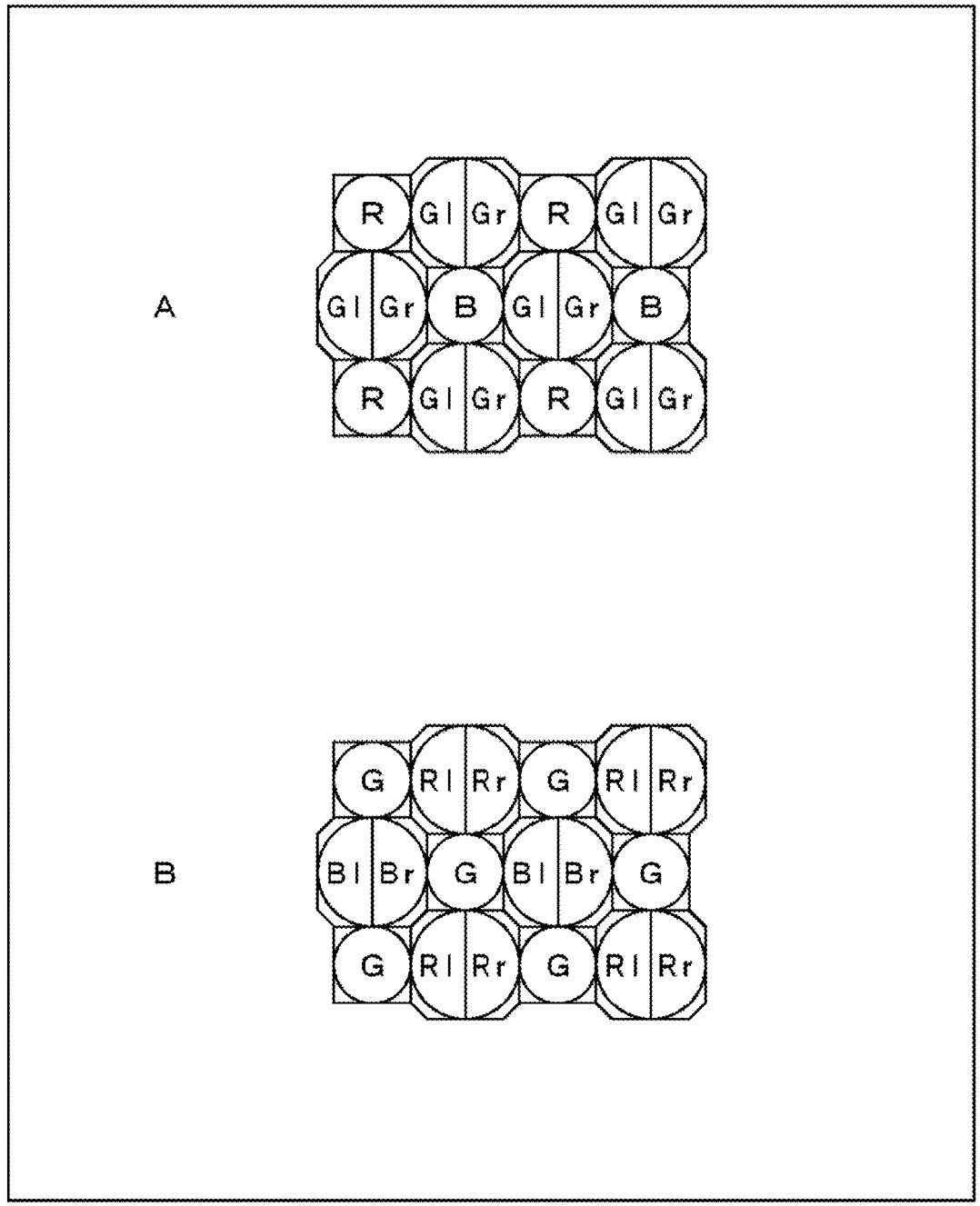
FIG. 40 A diagram showing arrangement examples of modified examples of the phase-difference detection pixels.

FIG. 40 shows arrangement examples of modified examples of the phase-difference detection pixels 40 in the solid-state image pickup device to which the present disclosure is applied. FIG. 40 extracts and shows 18 (=6*3) pixels of the solid-state image pickup device. In this modified example, a pair of phase-difference detection pixels are formed having a size larger than the size of the normal pixel. The pair of phase-difference detection pixels are arranged in a checkerboard pattern.

In the case of A of the figure, G1 and Gr having selective sensitivity to G are a pair of phase-difference detection pixels. G1 and Gr are formed having a size larger than the size of the normal pixel having selective sensitivity to R or B.

In the case of B of the figure, R1 and Rr having selective sensitivity to R and B1 and Br having selective sensitivity to B are pairs of phase-difference detection pixels. R1 and Rr or B1 and Br are formed having a size larger than the size of the normal pixel having selective sensitivity to G.

<Regarding Problems in Case Where Outputs of Phase-Difference Detection Pixels are Used as Color Signals>

By the way, for example, as in the arrangement example shown in FIG. 20 and the like, in the case where, regarding a particular color (in the case of FIG. 20, G), the normal pixels 30 and the phase-difference detection pixels 40 are arranged on the solid-state image pickup device, color signals corresponding to the positions of the phase-difference detection pixels 40 can be compensated for by using outputs of the normal pixels 30 of the same color located in vicinity thereof. Therefore, it is only necessary to use the outputs of the phase-difference detection pixels 40 only for the purpose of calculating phase detection signals.

However, for example, as in the arrangement example shown in FIG. 34 and the like, in the case where all pixels of a particular color (in the case of FIG. 34, G) are set to be the phase-difference detection pixels 40, the normal pixels 30 of the same color are not present. Therefore, it is necessary to use the outputs of the phase-difference detection pixels 40 not only for the purpose of calculating phase detection signals but also as color signals.

It should be noted that, in the case where the outputs of the phase-difference detection pixels 40 are also used as color signals, the normal pixels 30 of colors (in the case of FIG. 34, R and B) different from that particular color are different in shape from the on-chip lenses, and hence there is a difference in the oblique incidence characteristic and the following problem occurs. This problem will be described with reference to FIG. 41.

Figure 41:
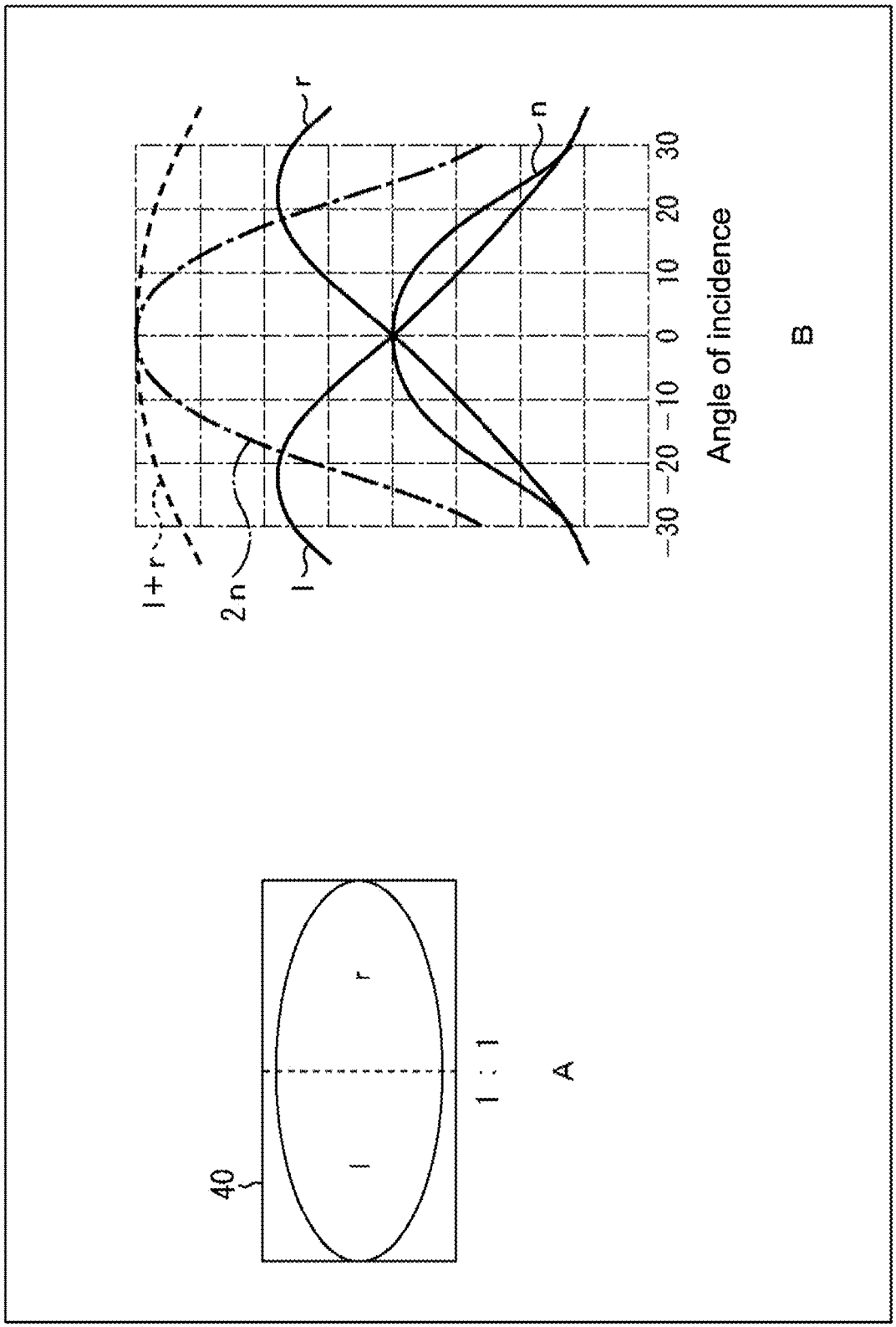
FIG. 41 A diagram describing a problem in the case where outputs of the phase-difference detection pixels are used as color signals.

A of FIG. 41 shows a case where a pair of phase-difference detection pixels constituted of the phase-difference detection pixels 40 that are two pixels having the same color share the shared on-chip lens 41. In the figure, one of the pair of phase-difference detection pixels will be referred to as a phase-difference detection pixel 40l (light) and the other will be referred to as a phase-difference detection pixel 40r (right).

B of FIG. 41 shows an oblique incidence characteristic at CRA=0 deg of the phase-difference detection pixels 40l and 40r. In the figure, the horizontal axis indicates an angle of incidence and the vertical axis indicates sensitivity. Further, in B of FIG. 41, the curve 1 indicates an oblique incidence characteristic of the phase-difference detection pixel 40l, the curve r indicates an oblique incidence characteristic of the phase-difference detection pixel 40r, and the curve n indicates an oblique incidence characteristic of the normal pixel 30 different in color from the phase-difference detection pixel 40. The curve l+r is one obtained by adding the curve l with the curve r and the curve 2n is one obtained by doubling the value of the curve n.

If the curve l+r representing the addition value of the phase-difference detection pixel 40l and the phase-difference detection pixel 40r coincides with the curve 2n representing the double value of the sensitivity of the normal pixel 30, the oblique incidence characteristic of the phase-difference detection pixels 40l and 40r would coincide with the oblique incidence characteristic of the normal pixel 30. However, both do not coincide with each other as will be clear from B of FIG. 41.

Regarding a solid-state image pickup device in which the phase-difference detection pixels 40l and 40r is different in the oblique incidence characteristic from the normal pixel 30 as described above, no problems occur in the case where it is incorporated in a fixed-focus camera employed in a smartphone or the like. However, in the case where it is incorporated in an image pickup apparatus (single-lens reflex camera, compact camera, or the like) whose stop f-number and focal distance f are variable, inconvenience that the sensitivity ratio of the phase-difference detection pixels 40l and 40r and the normal pixels 30 changes and WB (white balance) is broken occurs.

In view of this, a configuration example of a phase-difference detection pixel whose oblique incidence characteristic is made coinciding with that of the normal pixel (fourth configuration example of the phase-difference detection pixel in the solid-state image pickup device to which the present disclosure is applied), by which the occurrence of such inconvenience can be suppressed, will be described hereinafter.

<Fourth Configuration Example of Phase-Difference Detection Pixel in Solid-State Image Pickup Device to Which Present Disclosure is Applied>

Figure 42:
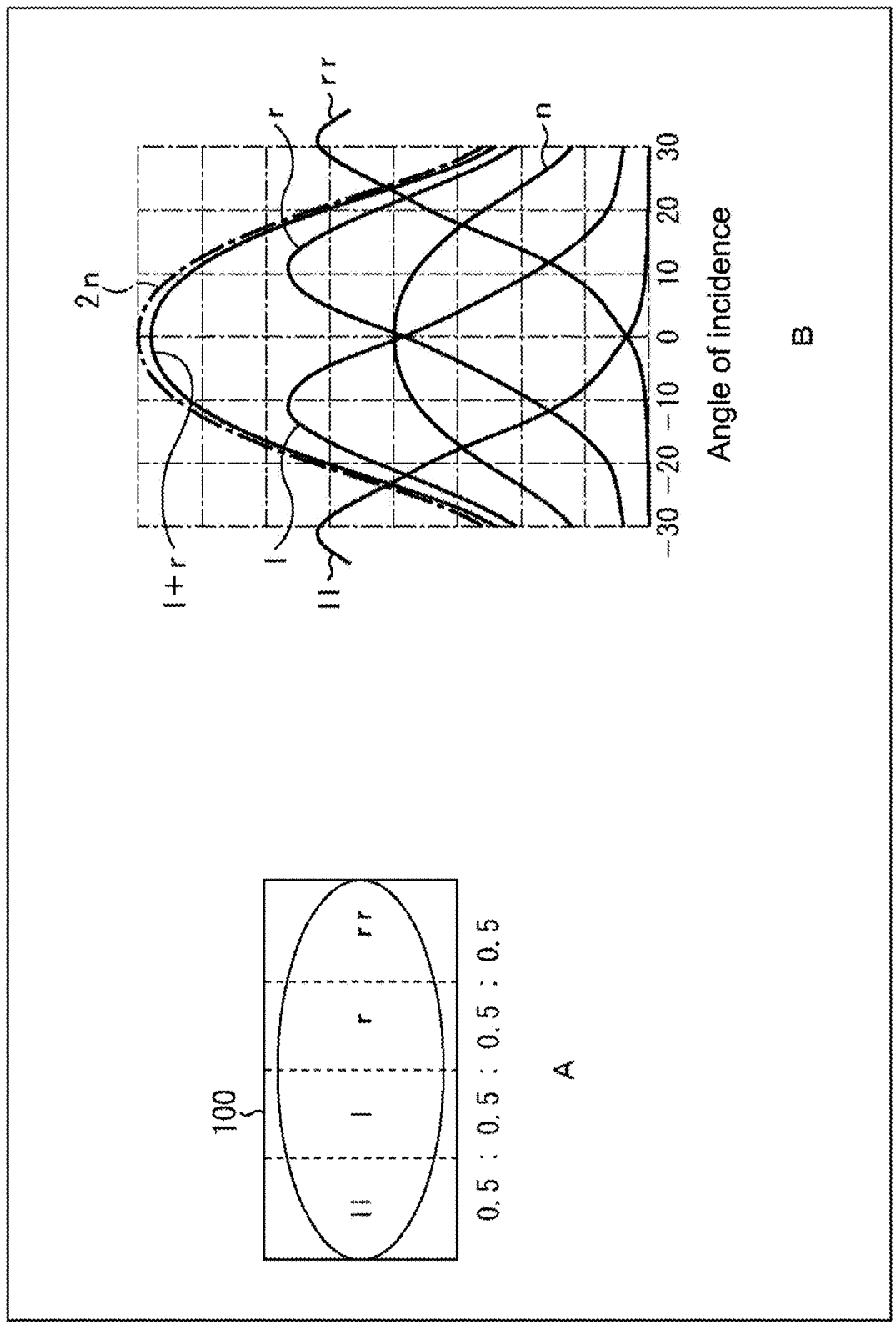
FIG. 42 A diagram showing the fourth configuration example of the phase-difference detection pixel in the solid-state image pickup device to which the present disclosure is applied.

A of FIG. 42 shows the fourth configuration example of the phase-difference detection pixel. This phase-difference detection pixel 100 is set to have a size corresponding to two pixels of the normal pixels 30. Regarding the photoelectric converter, the size corresponding to two pixels of the normal pixels 30 is divided into four regions at approximately 0.5:0.5:0.5:0.5 in a horizontal direction and electric charges generated by each of them can be individually output. Hereinafter, the phase-difference detection pixel 100 in which the size corresponding to two pixels of the normal pixels 30 is divided into four regions will be referred to as a phase-difference detection pixel 100*ll*, a phase-difference detection pixel 100*l*, a phase-difference detection pixel 100*r*, and a phase-difference detection pixel 100*rr* in order from the left-hand side in the figure. The phase-difference detection pixels 100*ll* to 100*rr* are covered with one shared on-chip lens. The color of the color filter layer is common.

B of FIG. 42 shows oblique incidence characteristics of the phase-difference detection pixels 100*ll*, 100*l*, 100*r*, and 100*rr* at CRA=0 deg. In the figure, the horizontal axis indicates an angle of incidence and the vertical axis indicates sensitivity. Further, in B of FIG. 42, the curve 11 indicates an oblique incidence characteristic of the phase-difference detection pixel 100*ll*, the curve 1 indicates an oblique incidence characteristic of the phase-difference detection pixel 100*l*, the curve r indicates an oblique incidence characteristic of the phase-difference detection pixel 100*r*, the curve rr indicates an oblique incidence characteristic of the phase-difference detection pixel 100*rr*, and the curve n indicates an oblique incidence characteristic of the normal pixel 30 different in color from the phase-difference detection pixel 100. The curve l+r is one obtained by adding the curve l with the curve r and the curve 2n is one obtained by doubling the value of the curve n.

As will be clear from B of the figure, the curve l+r representing the addition value of the phase-difference detection pixel 100*l* and the phase-difference detection pixel 100*r* approximately coincides with the curve 2n representing the double value of the sensitivity of the normal pixel 30. Therefore, in the case of using the output of the phase-difference detection pixel 100 as a color signal, outputs of the phase-difference detection pixel 100*l* and the phase-difference detection pixel 100*r* are added and used. Regarding outputs of the phase-difference detection pixel 100*ll* and the phase-difference detection pixel 100*rr*, they are used for calculation of phase difference detection signals.

In the image pickup apparatus equipped with the solid-state image pickup device including the phase-difference detection pixels 100 and the normal pixels 30, it becomes possible to suppress the occurrence of the inconvenience due to non-coincidence of the oblique incidence characteristics of both.

Figure 43:
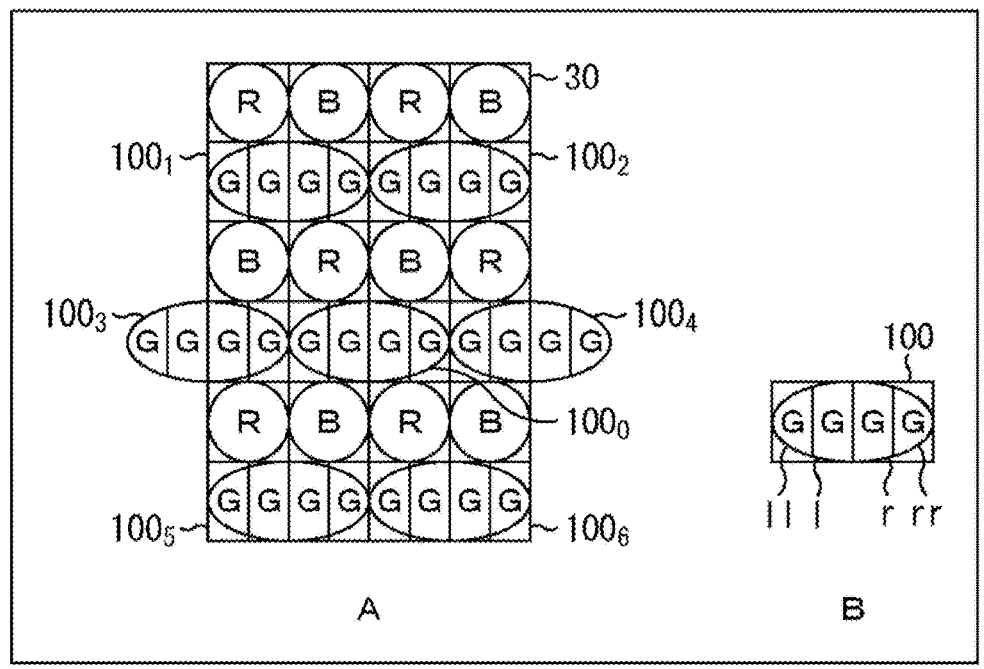
FIG. 43 A diagram showing a variation of the arrangement of phase-difference detection pixels.

FIG. 43 is an arrangement example of the phase-difference detection pixels 100 in the solid-state image pickup device to which the present disclosure is applied. FIG. 43 extracts and shows a region corresponding to 24 (=4*6) pixels of the normal pixels 30 from the solid-state image pickup device. In the arrangement example of the figure, the color of the color filter layer of the phase-difference detection pixel 100 is set to be G. In each row, all pixels are set to be the phase-difference detection pixels 100. The rows of the phase-difference detection pixels 100 are arranged in such a manner that phases thereof are alternately shifted by a semi-phase.

By the way, if the outputs of the phase-difference detection pixel 100*ll* and the phase-difference detection pixel 100*rr* are used only for calculation of phase difference detection signals and not used as color signals, in a lens (lens having small f-number) having a wider oblique incidence range, some signals are constantly collected to the phase-difference detection pixel 100*ll* and the phase-difference detection pixel 100*rr* and sensitivity loss occurs. In view of this, the outputs of the phase-difference detection pixel 100*ll* and the phase-difference detection pixel 100*rr* can also be used as color signals.

Specifically, a color signal 100G of a G-component corresponding to a position of a phase-difference detection pixel 1000 shown in A of FIG. 43 is computed by using outputs of the phase-difference detection pixel 1000 and phase-difference detection pixels 1001 to 1006 of the same color which surround it.

$$100G = 100S(100B/100A)$$

Here, 100S, 100A, and 100B are as follows.

$$100S = 100_0 ll + 100_0 l + 100_0 r + 100_0 rr$$

$$100A = (z0(100_0 ll + 100_0 l + 100_0 r + 100_0 rr) + z1(100_1 ll + 100_1 l + 100_1 r + 100_1 rr) + z2(100_2 ll + 100_2 l + 100_2 r + 100_2 rr) + z3(100_3 ll + 100_3 l + 100_3 r + 100_3 rr) + z4(100_4 ll + 100_4 l + 100_4 r + 100_4 rr) + z5(100_5 ll + 100_5 l + 100_5 r + 100_5 rr) + z6(100_6 ll + 100_6 l + 100_6 r + 100_6 rr))/(z0 + z1 + z2 + z3 + z4 + z5 + z6)$$

$$100B = (z0(100_0 l + 100_0 r) + z1(100_1 l + 100_1 r) + z2(100_2 l + 100_2 r) + z3(100_3 l + 100_3 r) + z4(100_4 l + 100_4 r) + z5(100_5 l + 100_5 r) + z6(100_6 l + 100_6 r))/(z0 + z1 + z2 + z3 + z4 + z5 + z6)$$

Note that z0 to z6 in 100A and 100B are predetermined coefficients. For example, they may be all 1. Weighting may be performed in a manner that depends on a spatial distance from the central pixel. Further fragmented coefficients may be set for four outputs ll, l, r, and rr of the phase-difference detection pixel 100. It is only necessary to set them considering the balance between the resolution and the SN ratio.

The color signal 100G calculated in this manner reduces the noise level while the oblique incidence characteristic is made coinciding with the normal pixel. Thus, the SN ratio of an image can be improved.

Figure 44:
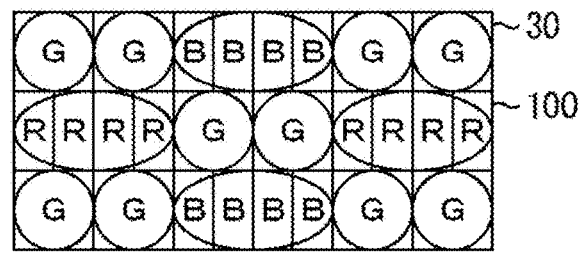
FIG. 44 A diagram showing a variation of the arrangement of phase-difference detection pixels.

FIG. 44 is another arrangement example of the phase-difference detection pixels 100 in the solid-state image pickup device to which the present disclosure is applied. FIG. 44 extracts and shows a region corresponding to 18 (=6*3) pixels of the normal pixels 30 from the solid-state image pickup device. In the arrangement example of the figure, the color of the color filter layer of the phase-difference detection pixel 100 is set to be B or R. The normal pixels 30 of the two pixels of G, the phase-difference detection pixels 100*l* to 100*rr* of B, and the phase-difference detection pixels 100*l* to 100*rr* of R are arranged in accordance with the Bayer array.

Figure 45:
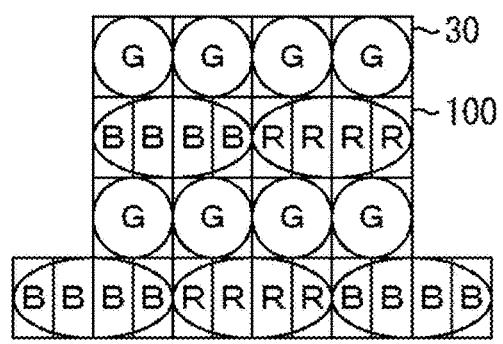
FIG. 45 A diagram showing a variation of the arrangement of phase-difference detection pixels.

FIG. 45 is still another arrangement example of the phase-difference detection pixels 100 in the solid-state image pickup device to which the present disclosure is applied. FIG. 45 extracts and shows a region corresponding to 16 (=4*4) pixels of the normal pixels 30 from the solid-state image pickup device. In the arrangement example of the figure, the color of the color filter layer of the phase-difference detection pixel 100 is set to be B or R. In each row, all pixels are set to be the phase-difference detection pixels 100. The rows of the phase-difference detection pixels 100 are arranged in such a manner that phases thereof are alternately shifted by a semi-phase. In each row of the phase-difference detection pixels 100, the phase-difference detection pixels 100*l* to 100*rr* of B and the phase-difference detection pixels 100*l* to 100*rr* of R are alternately arranged.

Note that the color and arrangement of the phase-difference detection pixels 100 in the solid-state image pickup device are not limited to those of the above-mentioned arrangement example.

<Fifth Configuration Example of Phase-Difference Detection Pixel in Solid-State Image Pickup Device to Which Present Disclosure is Applied>

Figure 46:
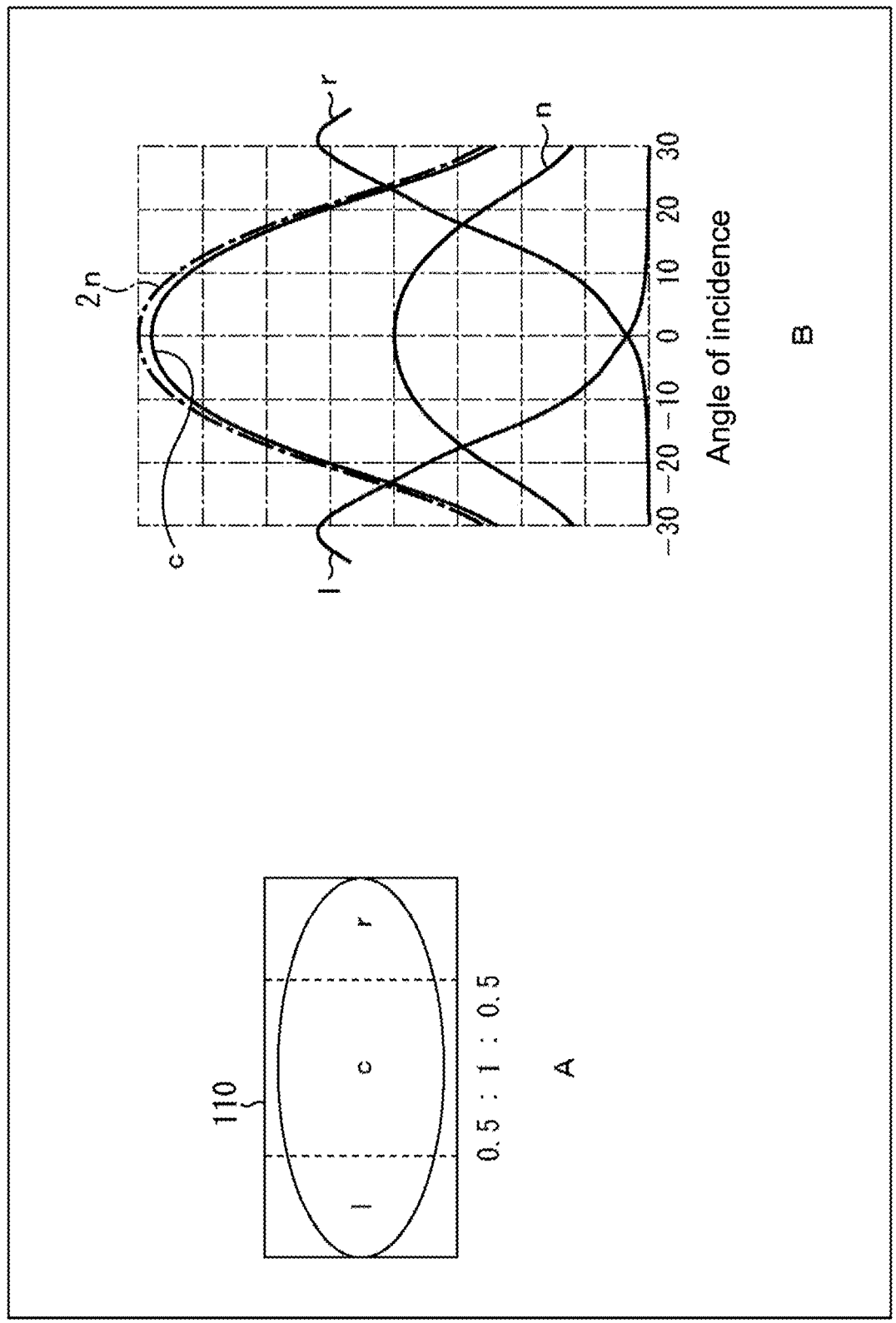
FIG. 46 A diagram showing the fifth configuration example of the phase-difference detection pixel in the solid-state image pickup device to which the present disclosure is applied.

A of FIG. 46 shows the fifth configuration example of the phase-difference detection pixel. This phase-difference detection pixel 110 is set to have a size corresponding to two pixels of the normal pixels 30. Regarding the photoelectric converter, the size corresponding to two pixels of the normal pixels 30 is divided into three regions at approximately 0.5:1:0.5 in the horizontal direction and electric charges generated by each of them can be individually output. Hereinafter, the phase-difference detection pixel 110 obtained by dividing the size corresponding to two pixels of the normal pixels 30 into three regions will be referred to as a phase-difference detection pixel 110*l*, a phase-difference detection pixel 110*c*, and a phase-difference detection pixel 110*r* in order from the left-hand side in the figure. The phase-difference detection pixels 110*l*, 110*c*, and 110*r* are covered with one shared on-chip lens. The color of the color filter layer is common.

B of FIG. 46 shows oblique incidence characteristics of the phase-difference detection pixels 110*l*, 110*c*, and 110*r* at CRA=0 deg. In the figure, the horizontal axis indicates an angle of incidence and the vertical axis indicates sensitivity. Further, in B of FIG. 46, the curve 1 indicates an oblique incidence characteristic of the phase-difference detection pixel 110*l*, the curve c indicates an oblique incidence characteristic of the phase-difference detection pixel 110*c*, the curve r indicates an oblique incidence characteristic of the phase-difference detection pixel 110*r*, and the curve n indicates an oblique incidence characteristic of the normal pixel 30 different in color from the phase-difference detection pixel 110. The curve 2*n* is one obtained by doubling the value of the curve n.

As will be clear from B of the figure, the curve c indicating the sensitivity of the phase-difference detection pixel 110*c* approximately coincides with the curve 2*n* representing the double value of the sensitivity of the normal pixel 30. Therefore, in the case of using the output of the phase-difference detection pixel 110 as a color signal, an output of the phase-difference detection pixel 110*c* is used. Regarding outputs of the phase-difference detection pixel 110*l* and the phase-difference detection pixel 110*r*, they are used for calculation of phase difference detection signals.

In the image pickup apparatus equipped with the solid-state image pickup device including the phase-difference detection pixels 110 and the normal pixels 30, it becomes possible to suppress the occurrence of the inconvenience due to non-coincidence of the oblique incidence characteristics of both.

Figure 47:
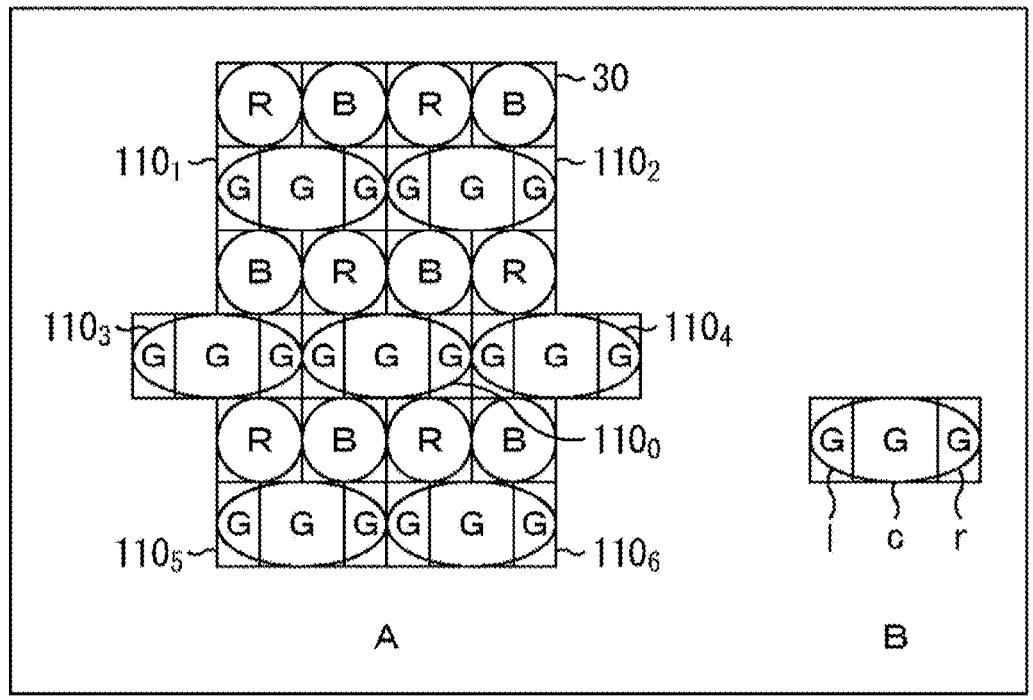
FIG. 47 A diagram showing a variation of the arrangement of phase-difference detection pixels.

FIG. 47 is an arrangement example of the phase-difference detection pixels 110 in the solid-state image pickup device to which the present disclosure is applied. FIG. 47 extracts and shows a region corresponding to 24 (=4*6) pixels of the normal pixels 30 from the solid-state image pickup device. In the arrangement example of the figure, the color of the color filter layer of the phase-difference detection pixels 110 is set to be G. In each row, all pixels are set to be the phase-difference detection pixels 110. The rows of the phase-difference detection pixels 110 are arranged in such a manner that phases thereof are alternately shifted by a semi-phase.

By the way, if the outputs of the phase-difference detection pixel 110*l* and the phase-difference detection pixel 110*r* are only used for calculation of phase difference detection signals and not used as color signals, in a lens (lens having small f-number) having a wider oblique incidence range, some signals are constantly collected to the phase-difference detection pixel 110*l* and the phase-difference detection pixel 110*r* and sensitivity loss occurs. In view of this, the outputs of the phase-difference detection pixel 110*l* and the phase-difference detection pixel 110*r* can also be used as color signals.

Specifically, the color signal 100G of a G-component corresponding to a position of a phase-difference detection pixel $110_0$ shown in A of FIG. 47 is computed by using outputs of the phase-difference detection pixel $110_0$ and phase-difference detection pixels $110_1$ to $110_6$ of the same color which surround it.

$$110G = 110S(110B/110A)$$

Here, 110S, 110A, and 110B are as follows.

$$110S = 110_0l + 110_0l + 110_0r$$

$$110A = (z0(110_0l + 110_0c + 110_0r) + z1(110_1l + 110_1c + 110_1r) + z2(110_2l + 110_2c + 110_2r) + z3(110_3l + 110_3c + 110_3r) + z4(110_4l + 110_4c + 110_4r) + z5(110_5l + 110_5c + 110_5r) + z6(110_6l + 110_6c + 110_6r))/(z1 + z1 + z2 + z3 + z4 + z5 + z6)$$

$$110B = (z0(110_0l + 110_0r) + z1(110_1l + 110_1r) + z2(110_2l + 110_2r) + z3(110_3l + 110_3r) + z4(110_4l + 110_4r) + z5(110_5l + 110_5r) + z6(110_6l + 110_6r))/(z0 + z1 + z2 + z3 + z4 + z5 + z6)$$

Note that z0 to z6 in 110A and 110B are predetermined coefficients. For example, they may be all 1. Weighting may be performed in a manner that depends on a spatial distance from the central pixel. Further fragmented coefficients may be set for three outputs l, c, and r of the phase-difference detection pixel 110. It is only necessary to set them considering the balance between the resolution and the SN ratio.

The color signal 110G calculated in this manner reduces the noise level while the oblique incidence characteristic is made coinciding with the normal pixel. Thus, the SN ratio of an image can be improved.

Note that the color and arrangement of the phase-difference detection pixels 110 in the solid-state image pickup device are not limited to those of the above-mentioned arrangement example. For example, color and arrangement similar to those of FIGS. 43 to 45 are applicable.

<Sixth Configuration Example of Phase-Difference Detection Pixel in Solid-State Image Pickup Device to Which Present Disclosure is Applied>

Figure 48:
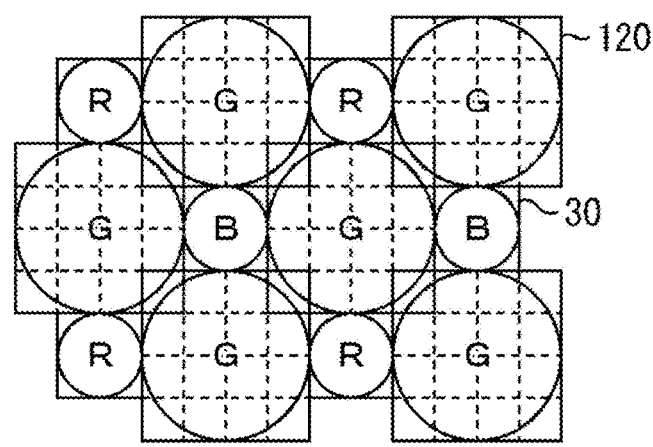
FIG. 48 A diagram showing a sixth configuration example of the phase-difference detection pixel and an arrangement example thereof.

FIG. 48 shows a sixth configuration example of the phase-difference detection pixel and an arrangement example thereof in the solid-state image pickup device. This phase-difference detection pixel 120 is set to have a size four times as large as that of the normal pixel 30. Regarding the photoelectric converter, the size corresponding to four pixels of the normal pixels 30 is divided into four regions at approximately 0.5:0.5:0.5:0.5 in the each of the vertical and horizontal directions and electric charges generated by each of them can be individually output. The phase-difference detection pixel 120 is covered with one shared on-chip lens.

The color of the color filter layer of the respective divided regions is common. Further, in the arrangement example of the figure, regarding the phase-difference detection pixels 120, the color of the color filter layer is set to be G. In the solid-state image pickup device, the phase-difference detection pixels 120 of G and the normal pixels 30 of B or R are arranged in accordance with the Bayer array.

Note that, although the illustration is omitted, the oblique incidence characteristic of the phase-difference detection pixel 120 is similar to that of B of FIG. 42. Therefore, in the case of using the output of the phase-difference detection pixel 120 as a color signal, outputs of four blocks at a center of 16 divided blocks of the phase-difference detection pixel 120 are used. Outputs of other blocks are used only for calculation of phase difference detection signals and not used as color signals.

Figure 49:
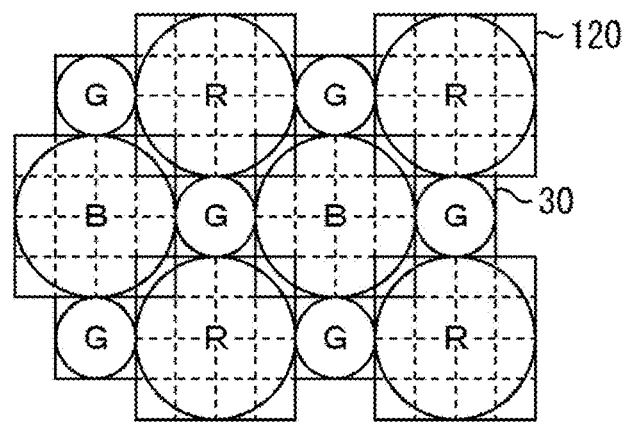
FIG. 49 A diagram showing a variation of the arrangement of phase-difference detection pixels.

FIG. 49 shows an arrangement example of the phase-difference detection pixels 120 in the solid-state image pickup device. In the arrangement example of the figure, regarding the phase-difference detection pixels 120, the color of the color filter layer is set to be B or R. In the solid-state image pickup device, the phase-difference detection pixels 120 of B or R and the normal pixels 30 of G are arranged in accordance with the Bayer array.

Note that the color and arrangement of the phase-difference detection pixels 120 in the solid-state image pickup device are not limited to those of the above-mentioned arrangement example.

In the image pickup apparatus equipped with the solid-state image pickup device including the phase-difference detection pixels 120 and the normal pixels 30, it becomes possible to suppress the occurrence of the inconvenience due to non-coincidence of the oblique incidence characteristics of both.

<Seventh Configuration Example of Phase-Difference Detection Pixel in Solid-State Image Pickup Device to Which Present Disclosure is Applied>

Figure 50:
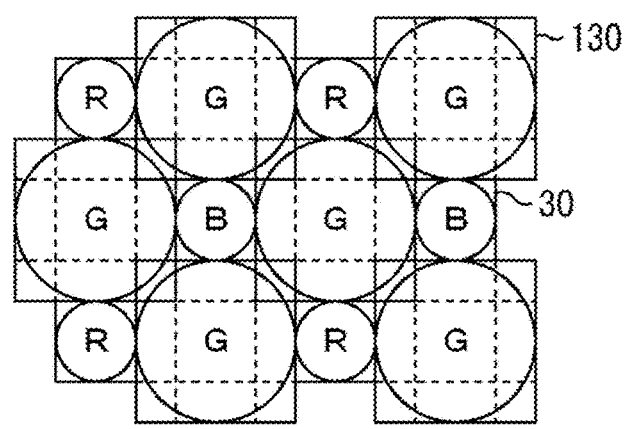
FIG. 50 A diagram showing a seventh configuration example of the phase-difference detection pixel and an arrangement example thereof.

FIG. 50 shows a seventh configuration example of the phase-difference detection pixel and an arrangement example thereof in the solid-state image pickup device. This phase-difference detection pixel 130 is set to have a size four times as large as that of the normal pixel 30. Regarding the photoelectric converter, the size corresponding to four pixels of the normal pixels 30 is divided into three regions at approximately 0.5:1:0.5 in the each of the vertical and horizontal directions and electric charges generated by each of them can be individually output. The phase-difference detection pixel 130 is covered with one shared on-chip lens. The color of the color filter layer of the respective divided regions is common. Further, in the arrangement example of the figure, regarding the phase-difference detection pixels 130, the color of the color filter layer is set to be G. In the solid-state image pickup device, the phase-difference detection pixels 130 of G and the normal pixels 30 of B or R are arranged in accordance with the Bayer array.

Note that, although the illustration is omitted, the oblique incidence characteristic of the phase-difference detection pixel 130 is similar to that of B of FIG. 46. Therefore, in the case of using the output of the phase-difference detection pixel 130 as a color signal, an output of one block at a center of 9 divided blocks of the phase-difference detection pixel 120 is used. Outputs of other blocks are used only for calculation of phase difference detection signals and not used as color signals.

Figure 51:
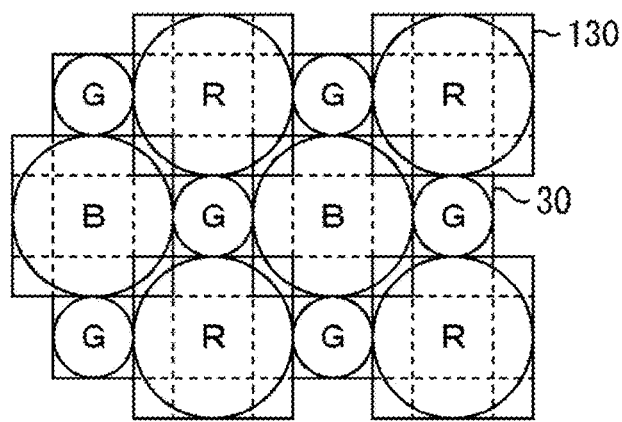
FIG. 51 A diagram showing a variation of the arrangement of phase-difference detection pixels.

FIG. 51 shows an arrangement example of the phase-difference detection pixels 130 in the solid-state image pickup device. In the arrangement example of the figure, regarding the phase-difference detection pixels 130, the color of the color filter layer is set to be B or R. In the solid-state image pickup device, the phase-difference detection pixels 130 of B or R and the normal pixels 30 of G are arranged in accordance with the Bayer array.

Note that the color and arrangement of the phase-difference detection pixels 130 in the solid-state image pickup device are not limited to those of the above-mentioned arrangement example.

In the image pickup apparatus equipped with the solid-state image pickup device including the phase-difference detection pixels 130 and the normal pixels 30, it becomes possible to suppress the occurrence of the inconvenience due to non-coincidence of the oblique incidence characteristics of both.

<Usage Example of Solid-State Image Pickup Device to Which Present Disclosure is Applied>

Figure 52:
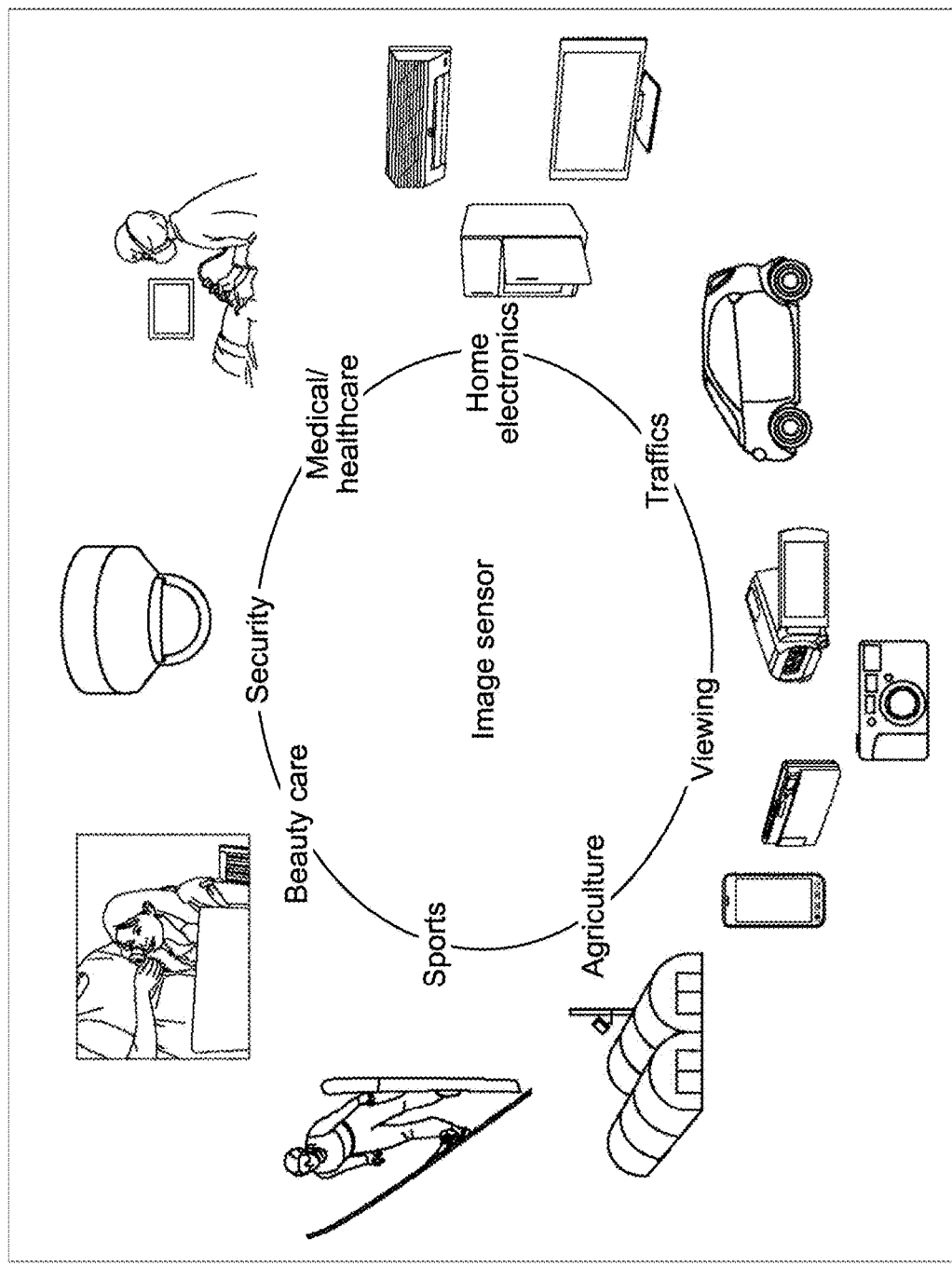
FIG. 52 A diagram showing a usage example of the solid-state image pickup device to which the present disclosure is applied.

FIG. 52 is a diagram showing a usage example that uses the above-mentioned solid-state image pickup device.

The solid-state image pickup device can be used in various cases of sensing light such as visible light, infrared light, ultraviolet light, and X-rays as follows.

An apparatus for photographing images to be viewed, such as a digital camera and a camera-equipped mobile apparatus An apparatus used for traffic purposes, such as a car-mounted camera that photographs front/rear/periphery/inside of an automobile, a surveillance camera that monitors running vehicles and roads, and a distance measurement sensor that measures distances among vehicles, for safe driving including automatic stop, recognition of a driver's state, and the like An apparatus used in home electronics such as a TV, a refrigerator, and an air conditioner, for photographing gestures of users and executing apparatus operations according to the gestures An apparatus used for medical and healthcare purposes, such as an endoscope and an apparatus that performs blood vessel photographing by receiving infrared light An apparatus used for security purposes, such as a surveillance camera for crime-prevention purposes and a camera for person authentication purposes An apparatus used for beauty care purposes, such as a skin measurement apparatus that photographs skins and a microscope that photographs scalps An apparatus used for sports purposes, such as an action camera and a wearable camera for sports purposes An apparatus for agriculture purposes, such as a camera for monitoring a state of fields and crops Embodiments of the present disclosure are not limited to the above-mentioned embodiments and various changes can be made without departing from the gist of the present disclosure.

The present disclosure can also take the following configurations.

(1)

A solid-state image pickup device in which a normal pixel that generates a pixel signal of an image and a phase-difference detection pixel that generates a pixel signal used in calculation of a phase-difference signal for controlling an image-surface phase difference AF function are arranged in a mixed manner, in which in the phase-difference detection pixel, a shared on-chip lens for condensing incident light to a photoelectric converter that generates a pixel signal used in calculation of the phase-difference signal is formed for every plurality of adjacent phase-difference detection pixels.

(2)

The solid-state image pickup device according to (1), in which in the normal pixel, an individual on-chip lens for condensing incident light to a photoelectric converter that generates a pixel signal of the image is formed for each normal pixel.

(3)

The solid-state image pickup device according to (1) or (2), an inter-pixel light-shielding structure is provided between the normal pixel and the normal pixel and between the normal pixel and the phase-difference detection pixel.

(4)

The solid-state image pickup device according to any of (1) to (3), in which an inter-pixel light-shielding structure is also provided between the phase-difference detection pixel and the phase-difference detection pixel.

(5)

The solid-state image pickup device according to any of (1) to (4), in which the phase-difference detection pixel includes an opening light-shielding structure that limits an opening of the photoelectric converter.

(6)

The solid-state image pickup device according to any of (1) to (5), in which in the phase-difference detection pixel, the shared on-chip lens is formed for every two adjacent pixels.

(7)

The solid-state image pickup device according to any of (1) to (5), in which in the phase-difference detection pixel, two shared on-chip lenses are formed for every three adjacent pixels.

(8)

The solid-state image pickup device according to any of (1) to (7), in which a boundary between the individual on-chip lens formed in the normal pixel and the shared on-chip lens formed in the phase-difference detection pixel is approximately rectangular or approximately hexagonal.

(9)

The solid-state image pickup device according to any of (1) to (6), in which a dummy light-condensing element structure is formed between the individual on-chip lens formed in the normal pixel and the shared on-chip lens formed in the plurality of adjacent phase-difference detection pixels.

(10)

The solid-state image pickup device according to (9), in which the dummy light-condensing element structure is formed non-symmetrically with respect to the plurality of phase-difference detection pixels that share the shared on-chip lens.

(11)

The solid-state image pickup device according to any of (1) to (10), in which the plurality of phase-difference detection pixels that share the shared on-chip lens are arranged in a checkerboard pattern.

(12)

The solid-state image pickup device according to any of (1) to (10), in which the phase-difference detection pixel is linearly arranged in at least either one of a row direction and a column direction.

(13)

The solid-state image pickup device according to any of (1) to (10), in which the phase-difference detection pixel is arranged in a stripe pattern in at least either one of a row direction and a column direction.

(14)

The solid-state image pickup device according to (13), in which the phase-difference detection pixels arranged in stripes adjacent to each other in the stripe form have phases shifted from each other.

(15)

The solid-state image pickup device according to any of (1) to (14), in which a color filter having selective sensitivity to three or more kinds of different wavelengths is provided for each pixel, and the plurality of phase-difference detection pixels that share the shared on-chip lens include the color filter having selective sensitivity to a same wavelength.

(16)

The solid-state image pickup device according to any of (1) to (14), in which a color filter having selective sensitivity to three or more kinds of different wavelengths is provided for pixel, and the plurality of phase-difference detection pixels that share the shared on-chip lens include the color filter having selective sensitivity to different wavelengths.

(17)

The solid-state image pickup device according to any of (1) to (16), in which the phase-difference detection pixel has a pixel size larger than that of the normal pixel.

(18)

The solid-state image pickup device according to any of (1) to (15), in which all pixels including a color filter having selective sensitivity to a particular wavelength of three or more kinds of different wavelengths are the phase-difference detection pixels, and an output of the phase-difference detection pixel are also used as a pixel signal of an image.

(19)

The solid-state image pickup device according to (18), in which the phase-difference detection pixel that shares the shared on-chip lens has a size that is an integer multiple of that of the normal pixel, the photoelectric converter of the phase-difference detection pixel is divided into a plurality of regions including a central region from which a same oblique incidence characteristic as a photoelectric converter of the normal pixel is obtained, and an output of the central region is also used as a pixel signal of an image.

(20)

The solid-state image pickup device according to (19), in which the phase-difference detection pixel that shares the shared on-chip lens has a size that is twice as large as that of the normal pixel, the photoelectric converter of the phase-difference detection pixel is divided into three regions at approximately 0.5:1:0.5, and an output of the region corresponding to 1 of the ratio is also used as a pixel signal of an image.

(21)

The solid-state image pickup device according to (19), in which the phase-difference detection pixel that shares the shared on-chip lens has a size that is twice as large as that of the normal pixel, the photoelectric converter of the phase-difference detection pixel is divided into four regions at approximately 0.5:0.5:0.5:0.5, and an addition value of outputs of the regions respectively corresponding to 0.5 and 0.5 at a center of the ratio is also used as a pixel signal of an image.

(22)

An electronic apparatus, including a solid-state image pickup device in which a normal pixel that generates a pixel signal of an image and a phase-difference detection pixel that generates a pixel signal used in calculation of a phase-difference signal for controlling an image-surface phase difference AF function are arranged in a mixed manner, in which in the phase-difference detection pixel, a shared on-chip lens for condensing incident light to a photoelectric converter that generates a pixel signal used in calculation of the phase-difference signal is formed for every plurality of adjacent phase-difference detection pixels.

REFERENCE SIGNS LIST 30 normal pixel, 31 individual on-chip lens, shielding structure, 34 photoelectric converter, 35 signal wiring layer, 40 phase-difference detection pixel, 41 shared on-chip lens, 50 phase-difference detection pixel, 51, 52 shared on-chip lens, 53 dummy light-condensing element structure, 60, 80, 90, 100, 110, 120, 130 phase-difference detection pixel

The invention claimed is:

1. An imaging device comprising:
a semiconductor substrate including first, second and third photoelectric conversion regions disposed along a first direction;
a first on-chip lens disposed above the first photoelectric conversion region;
a second on-chip lens disposed above the second and third photoelectric conversion regions;
a dummy light condensing element disposed above at least one of the second and third photoelectric conversion regions, wherein the dummy light condensing element is a convex lens and wherein the second and third photoelectric conversion regions share the second on-chip lens and the dummy light condensing element; and
a color filter layer disposed above the first, second and third photoelectric conversion regions and below the first on-chip lens, the second on-chip lens and the dummy light condensing element.

2. The imaging device according to claim 1, wherein the dummy light condensing element is smaller than the second on-chip lens.

3. The imaging device according to claim 1, wherein the dummy light condensing element is located between the first on-chip lens and the second on-chip lens.

4. The imaging device according to claim 1, wherein the dummy light condensing element is located on a first side of the second on-chip lens.

5. The imaging device according to claim 1, wherein the dummy light condensing element is located on a second side of the second on-chip lens.

6. The imaging device according to claim 1, wherein the dummy light condensing element includes first and second dummy light condensing sections located on opposite sides of the second on-chip lens.

7. The imaging device according to claim 1, wherein the dummy light condensing element fills a space between the first on-chip lens and the second on-chip lens.

8. The imaging device according to claim 1, wherein the first on-chip lens, the second on-chip lens and the dummy light condensing element are shifted relative to the first, second and third photoelectric conversion regions.

9. The imaging device according to claim 1, wherein the second on-chip lens is centered with respect to the second and third photoelectric conversion regions.

10. The imaging device according to claim 1, wherein the first on-chip lens has a different size from the second on-chip lens.

11. The imaging device according to claim 1, wherein the first on-chip lens is configured to focus incident light on the first photoelectric conversion region and the second on-chip lens is configured to focus incident light on the second and third photoelectric conversion regions.

12. The imaging device according to claim 1, wherein the color filter layer bandpasses green light.

13. The imaging device according to claim 1, wherein the first on-chip lens is smaller than the second on-chip lens.

14. The imaging device according to claim 1, wherein outputs from the second photoelectric conversion region and the third photoelectric conversion region represent a phase difference.

15. The imaging device according to claim 1, wherein a first separation region is disposed between the first photoelectric conversion region and the second photoelectric conversion region and wherein a second separation region is disposed between the second photoelectric conversion region and the third photoelectric conversion region.

16. The imaging device according to claim 15, wherein a light shield is disposed above the first separation region and a light shield is not disposed above the second separation region.

17. The imaging device according to claim 1, further comprising a wiring layer disposed below the semiconductor substrate.

18. A camera-equipped mobile apparatus comprising the imaging device according to claim 1.

19. An imaging device comprising:
a semiconductor substrate including first, second, third and fourth photoelectric conversion regions disposed along a first direction;
a first on-chip lens disposed above the first photoelectric conversion region;
a second on-chip lens disposed above the second and third photoelectric conversion regions;
a third on-chip lens disposed above the fourth photoelectric conversion region;
a dummy light condensing element disposed above at least one of the second and third photoelectric conversion regions, wherein the dummy light condensing element is a convex lens and wherein the second and third photoelectric conversion regions share the second on-chip lens and the dummy light condensing element; and
a first color filter disposed above the first, second and third photoelectric conversion regions and below the first on-chip lens, the second on-chip lens and the dummy light condensing element.

20. The imaging device according to claim 19, wherein the dummy light condensing element is smaller than the second on-chip lens.

21. The imaging device according to claim 19, wherein the dummy light condensing element is located between the first on-chip lens and the second on-chip lens.

22. The imaging device according to claim 19, wherein the dummy light condensing element is located between the second on-chip lens and the third on-chip lens.

23. The imaging device according to claim 19, wherein the dummy light condensing element includes a first dummy light condensing section located between the first on-chip lens and the second on-chip lens and a second dummy light condensing section located between the second on-chip lens and the third on-chip lens.

24. The imaging device according to claim 21, wherein the dummy light condensing element fills a space between the first on-chip lens and the second on-chip lens.

25. The imaging device according to claim 19, wherein the first on-chip lens, the second on-chip lens, the dummy light condensing element and the third on-chip lens are shifted relative to the first, second, third and fourth photoelectric conversion regions.

26. The imaging device according to claim 19, wherein the second on-chip lens is centered with respect to second and third photoelectric conversion regions.

27. The imaging device according to claim 19, wherein the first color filter bandpasses green light.

28. The imaging device according to claim 19, wherein the second and third photoelectric conversion regions comprise phase difference detection pixels.

29. The imaging device according to claim 19, wherein a separation region is disposed between the second and third photoelectric conversion regions and wherein a light shield is not disposed above the separation region.

* * * * *